United States Patent
Bruland

(10) Patent No.: US 7,297,972 B2
(45) Date of Patent: *Nov. 20, 2007

(54) METHODS AND SYSTEMS FOR POSITIONING A LASER BEAM SPOT RELATIVE TO A SEMICONDUCTOR INTEGRATED CIRCUIT USING A PROCESSING TARGET AS A METROLOGY TARGET

(75) Inventor: Kelly J. Bruland, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/365,468

(22) Filed: Feb. 28, 2006

(65) Prior Publication Data

US 2007/0045575 A1 Mar. 1, 2007

Related U.S. Application Data

(63) Continuation-in-part of application No. 11/213,329, filed on Aug. 26, 2005.

(51) Int. Cl.
*G01N 21/00* (2006.01)
*B23K 26/00* (2006.01)

(52) U.S. Cl. ............... 250/559.3; 250/559.29; 250/548; 356/614; 356/620; 438/128; 438/132; 219/121.6; 219/121.68; 219/121.69; 219/121.85

(58) Field of Classification Search ......... 250/559.29, 250/559.3, 548; 356/614, 620, 622; 219/121.6, 219/121.68, 121.69, 121.82, 121.83, 121.85; 348/128, 132

See application file for complete search history.

(56) References Cited

U.S. PATENT DOCUMENTS 4,358,659 A 11/1982 Spohnheimer 4,780,590 A 10/1988 Griner et al.
4,809,014 A 2/1989 Kempter et al.

(Continued)

FOREIGN PATENT DOCUMENTS

DE 102 34 943.6 7/2002

(Continued)

OTHER PUBLICATIONS

International Search Report and Written Opinion of PCT/US2006/032944, Dec. 28, 2006.

*Primary Examiner*—Davienne Monbleau
(74) *Attorney, Agent, or Firm*—Stoel Rives LLP

(57) ABSTRACT

Various methods and systems measure, determine, or align a position of a laser beam spot relative to a semiconductor substrate having structures on or within the semiconductor substrate to be selectively processed by delivering a processing laser beam to a processing laser beam spot. A metrology laser beam spot is directed to one or more of those structures to be selectively processed (e.g., laser-severable conductive links), and reflections of the metrology laser beam off of those structures to be selectively processed are detected to perform the measurement, determination, or alignment. The processing laser beam can then be accurately directed onto those structures to process them on a selective basis. The various methods and systems thus utilize those structures themselves—rather than relying exclusively on dedicated alignment markers—to perform the measurement, determination, or alignment.

36 Claims, 16 Drawing Sheets

U.S. PATENT DOCUMENTS

| | | |
|---|---|---|
| 4,877,175 A | 10/1989 | Marshall et al. |
| 4,941,082 A | 7/1990 | Pailthorp et al. |
| 5,869,383 A | 2/1999 | Chien et al. |
| 6,172,325 B1 | 1/2001 | Bard et al. |
| 6,320,243 B1 | 11/2001 | Jeong et al. |
| 6,483,071 B1 | 11/2002 | Hunter et al. |
| 6,573,473 B2 | 6/2003 | Hunter et al. |
| 6,593,542 B2 | 7/2003 | Baird et al. |
| 6,750,424 B2 | 6/2004 | Tanaka |
| 6,816,294 B2 | 11/2004 | Unrath et al. |
| 6,972,268 B2 * | 12/2005 | Ehrmann et al. ........... 438/795 |
| 7,027,155 B2 * | 4/2006 | Cordingley et al. ........ 356/401 |
| 7,064,809 B2 * | 6/2006 | Kemper et al. ............... 355/72 |
| 2005/0096779 A1 | 5/2005 | Markoya |
| 2005/0168715 A1 | 8/2005 | Kemper et al. |

FOREIGN PATENT DOCUMENTS

| | | |
|---|---|---|
| WO | WO 2004/015747 | 2/2004 |

\* cited by examiner

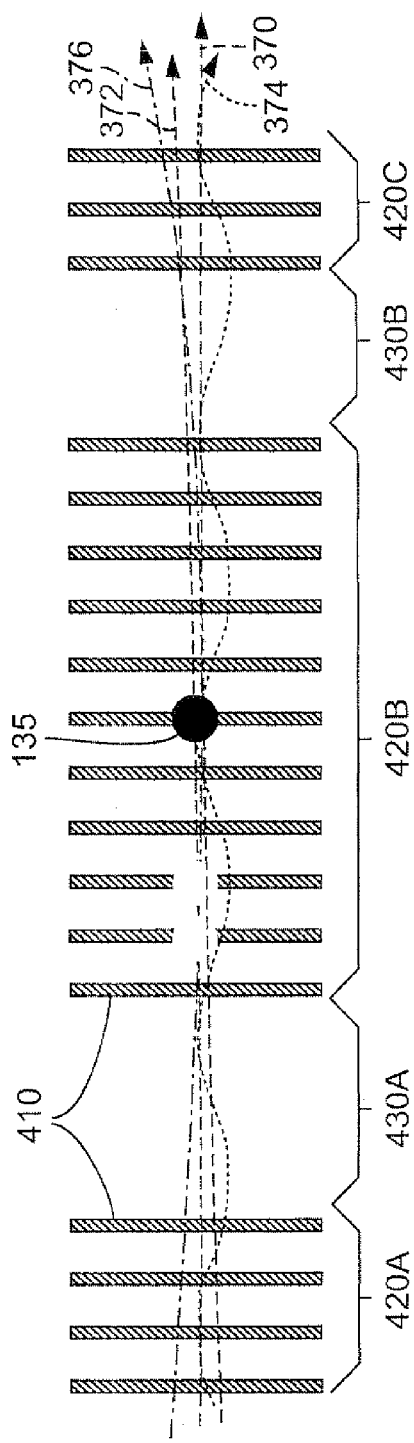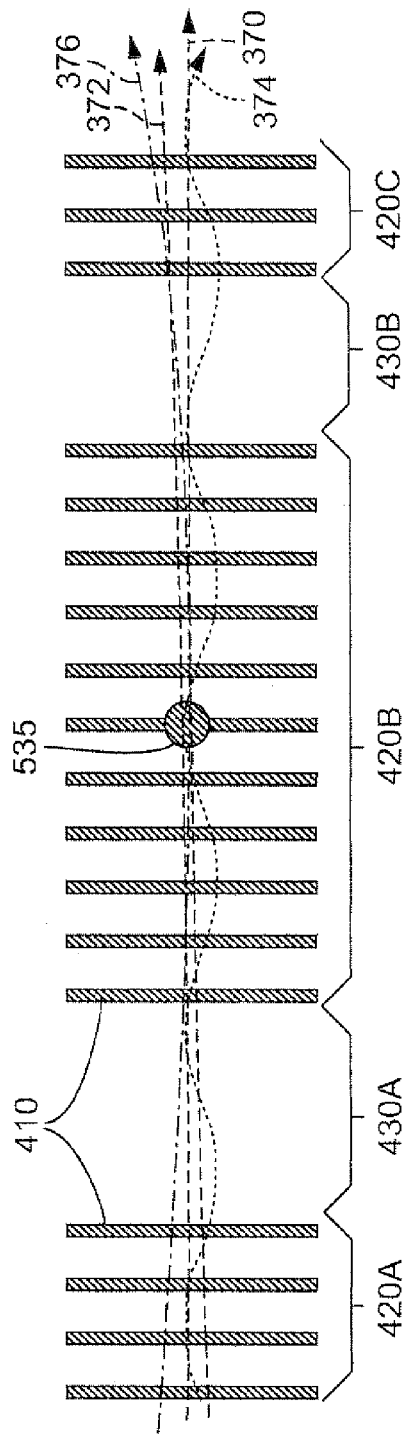

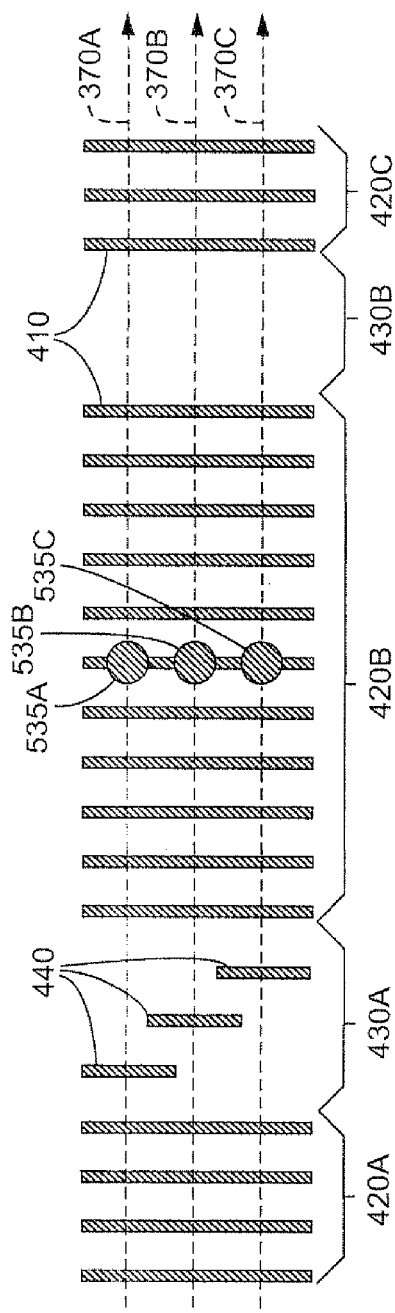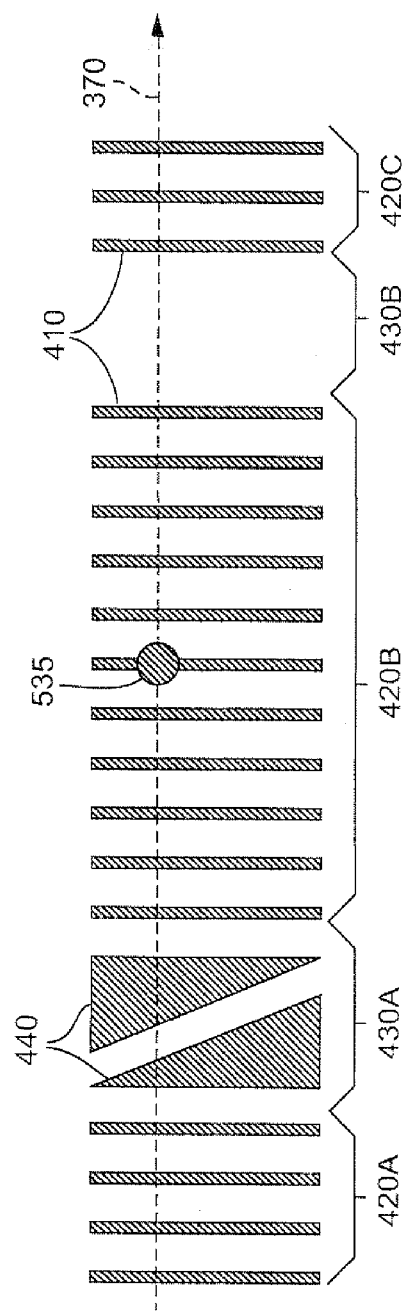

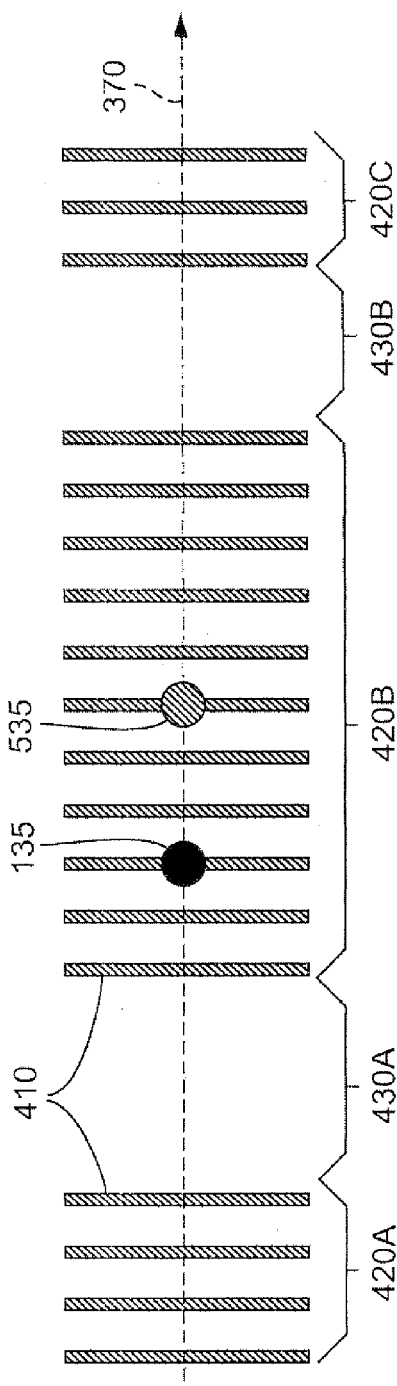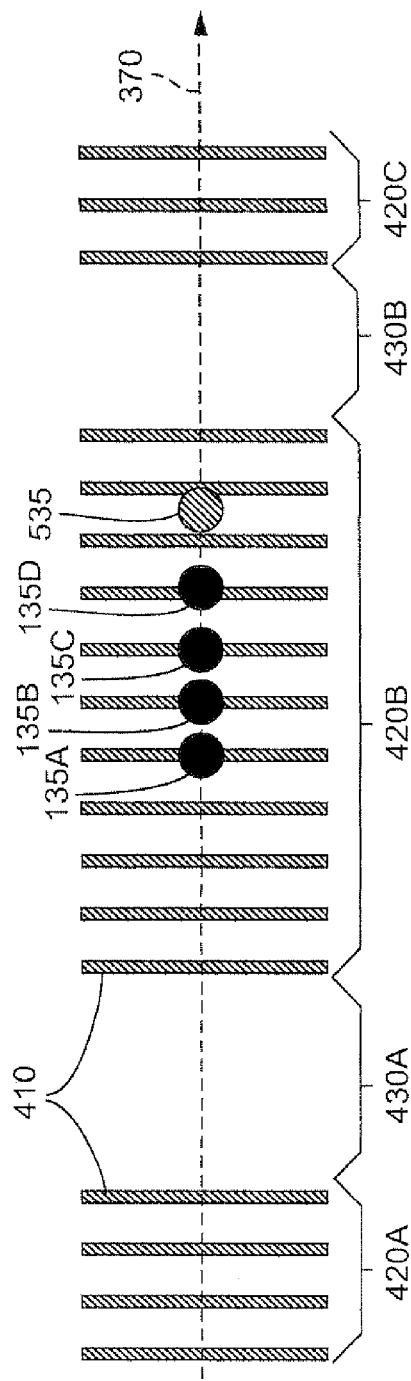

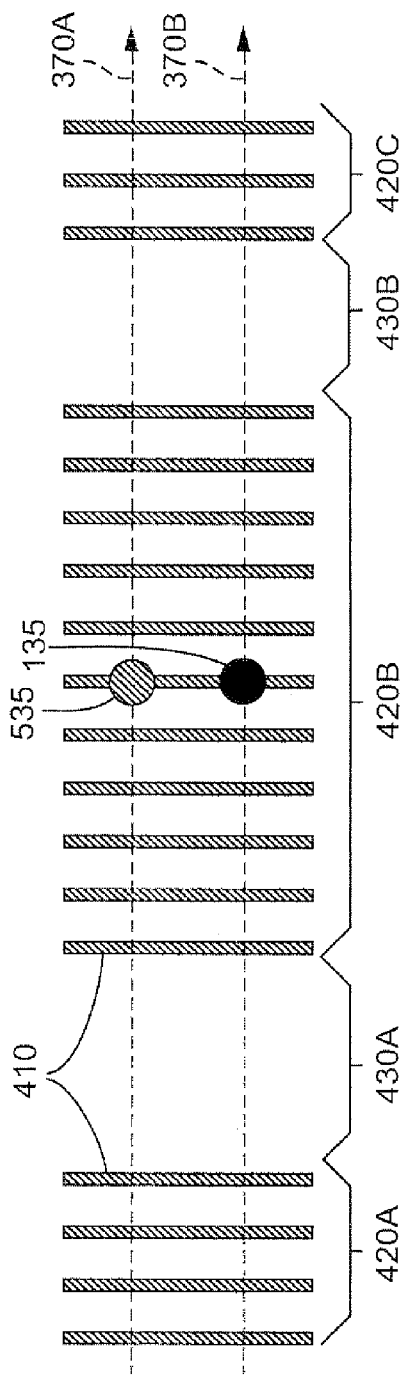
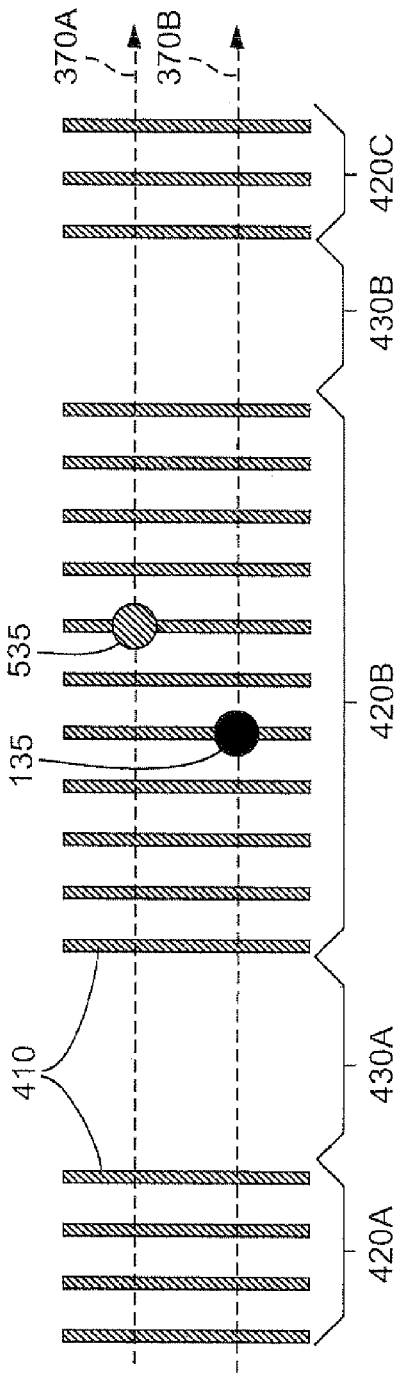

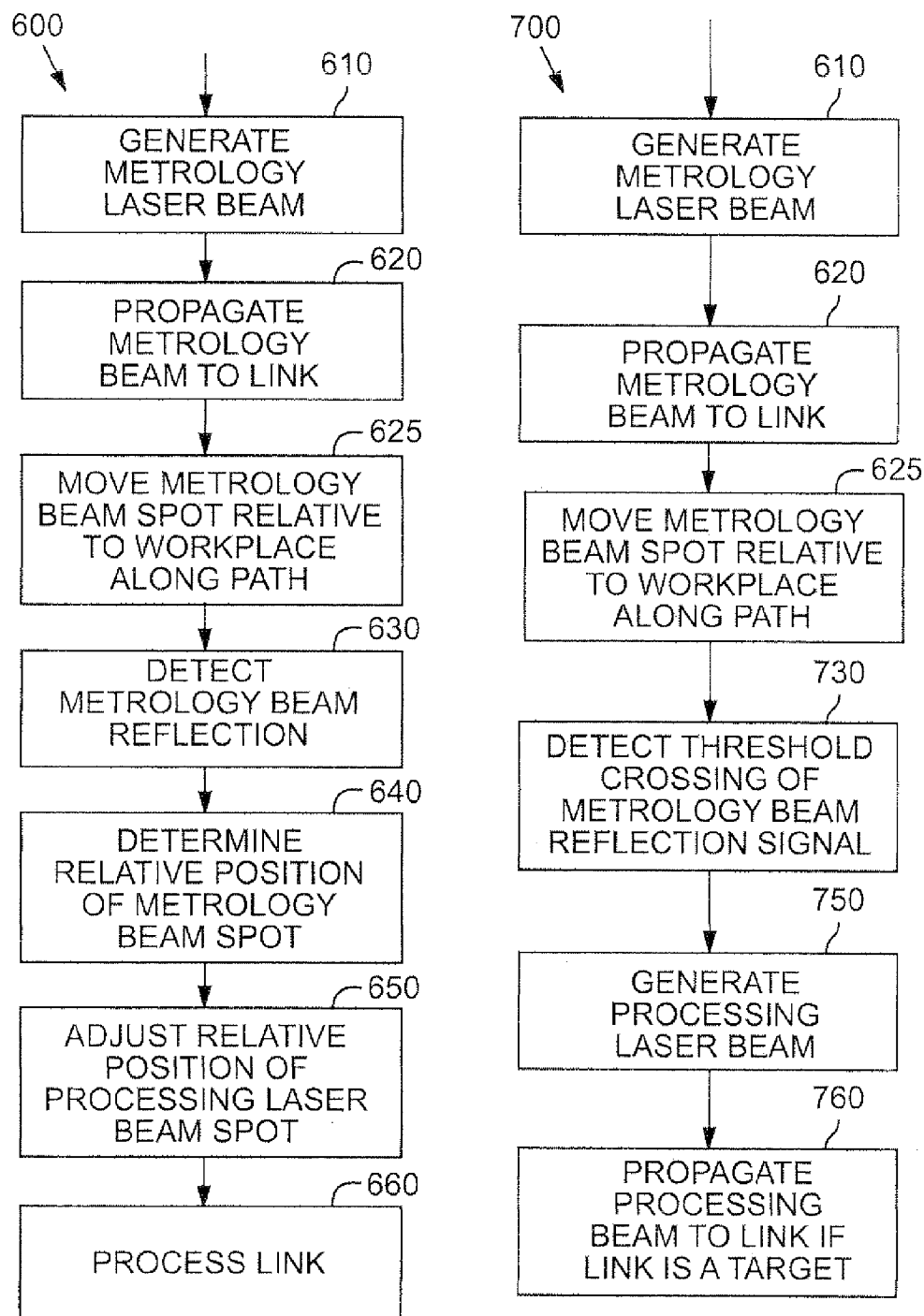

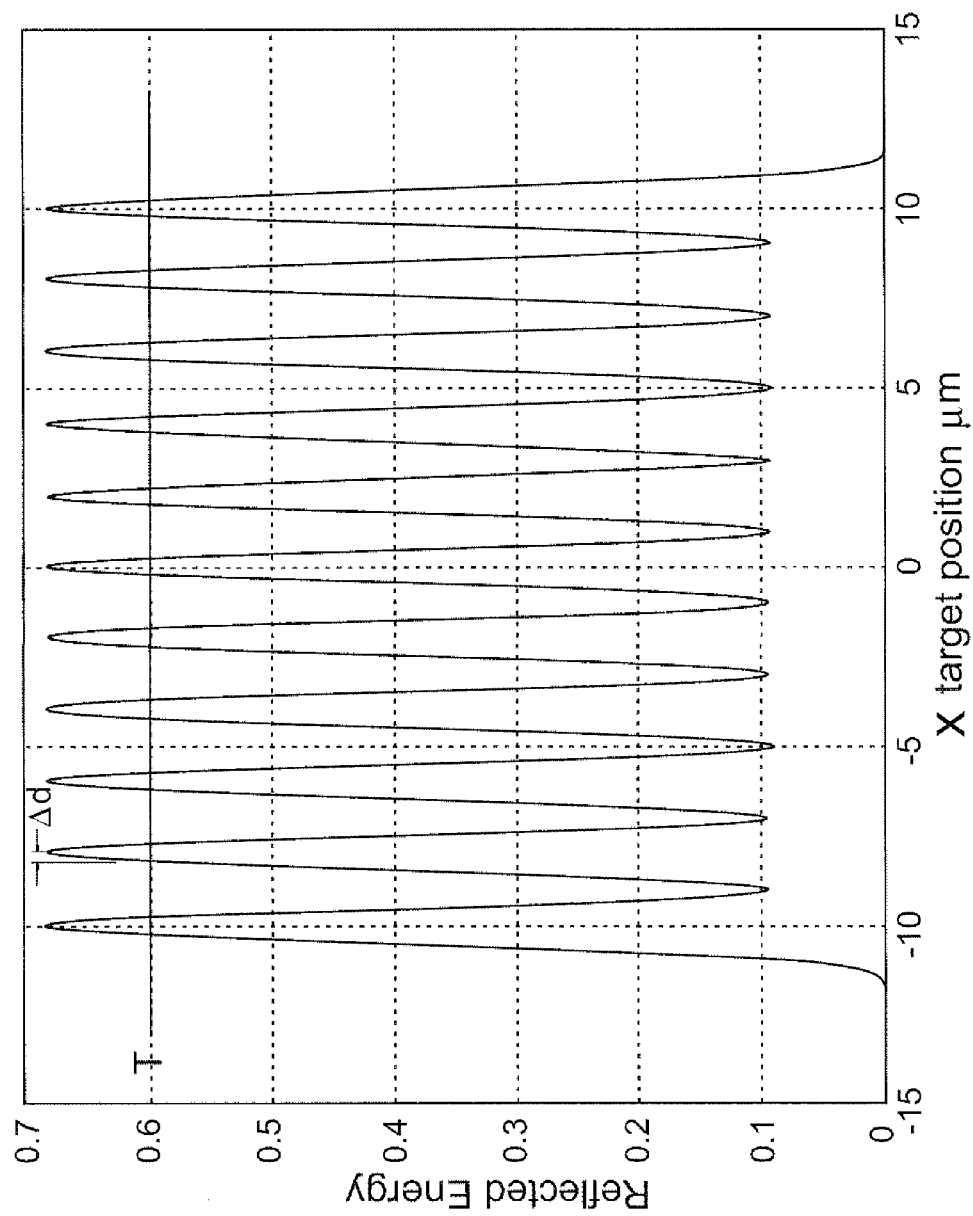

METHODS AND SYSTEMS FOR POSITIONING A LASER BEAM SPOT RELATIVE TO A SEMICONDUCTOR INTEGRATED CIRCUIT USING A PROCESSING TARGET AS A METROLOGY TARGET

RELATED APPLICATIONS

This application is a continuation-in-part of U.S. patent application Ser. No. 11/213,329, entitled "Methods and Systems for Positioning a Laser Beam Spot Relative to a Semiconductor Integrated Circuit Using a Processing Target as an Alignment Target," filed Aug. 26, 2005, which is incorporated herein by reference in its entirety and to which priority is claimed under 35 U.S.C. § 120.

TECHNICAL FIELD

This disclosure relates generally to the use of a laser to process a semiconductor integrated circuit during its manufacturing, and more particularly but not exclusively to positioning of a laser beam spot on or within a semiconductor integrated circuit.

BACKGROUND INFORMATION

During their fabrication process, ICs (integrated circuits) often incur defects due to minor imperfections in the process or in the semiconductor material. For that reason, ICs are usually designed to contain redundant circuit elements, such as spare rows and columns of memory cells in semiconductor memory devices, e.g., a DRAM (dynamic random access memory), an SRAM (static random access memory), or an embedded memory. Such devices are also designed to include laser-severable links between electrical contacts of the redundant circuit elements. Such links can be removed, for example, to disconnect a defective memory cell and to substitute a replacement redundant cell. Similar techniques are also used to sever links in order to program or configure logic products, such as gate arrays or ASICs (application-specific integrated circuits). After an IC has been fabricated, its circuit elements are tested for defects, and the locations of defects may be recorded in a data file or defect map. A laser-based link processing system can be employed to remove selected links so as to make the IC useful, provided positional information regarding the layout of the IC and the location of its circuit elements are known with sufficient accuracy.

SUMMARY OF THE DISCLOSURE

According to one embodiment, a method positions a laser beam spot relative to a semiconductor substrate having structures on or within the semiconductor substrate to be selectively processed by delivering a processing laser beam to a processing laser beam spot. The method generates a metrology laser beam and propagates the metrology laser beam along a propagation path to a metrology laser beam spot on or near a structure to be selectively processed. The method moves the laser beam spot relative to the semiconductor substrate such that an angular velocity of the semiconductor substrate about its center is less than a quotient of the speed of the laser beam spot relative to the semiconductor substrate divided by a distance between the semiconductor substrate's center and the laser beam spot. The method detects a reflection of the metrology laser beam from the structure, thereby generating a reflection signal, while said moving occurs, and determines, based on the reflection signal, a position of the metrology laser beam spot relative to the structure.

According to another embodiment, a method accurately sends laser beam pulses from a processing laser to selected processing target structures on or within a semiconductor substrate. At least a subset of the processing target structures are arranged in a substantially straight linear row extending in a lengthwise direction. The method generates a metrology laser beam and propagates the metrology laser beam along a propagation path to a metrology laser beam spot on or within the semiconductor substrate. The method moves the semiconductor substrate relative to the metrology laser beam spot predominantly in the lengthwise direction. The method detects reflected light energy from the processing target structures as the metrology laser beam spot moves relative to the semiconductor substrate, thereby generating a reflection signal as a function of distance in the lengthwise direction. The method generates processing pulses of the processing laser beam and propagates the processing pulses along a propagation path to a processing laser beam spot on or within the semiconductor substrate. The method determines, based on the reflection signal, where to position the processing laser beam spot relative to the semiconductor substrate so as to direct the processing pulses on selected processing target structures.

According to another embodiment, a system processes structures on or within a semiconductor substrate using a pulsed laser. The system comprises a laser source, a metrology laser propagation path, a processing laser propagation path, a motion stage, a sensor, and a controller, which is connected to the sensor and the motion stage. The laser source produces a metrology laser beam and a pulsed processing laser beam for impinging on selected ones of said structures. The metrology laser propagation path extends from the laser source to a metrology laser beam spot on or within the semiconductor substrate. The processing laser propagation path extends from the laser source to a processing laser beam spot on or within the semiconductor substrate. The motion stage is configured to cause relative motion between the semiconductor substrate and both the metrology laser beam spot and the processing laser beam spot such that the processing laser beam spot intersects said selected ones of said structures. The motion is in a substantially straight direction. The sensor is positioned to detect a magnitude of reflection of the metrology laser beam spot from the semiconductor substrate as the metrology laser beam spot moves relative to the semiconductor substrate, thereby generating a reflection signal. The controller is configured to determine, based on the reflection signal, where or when to generate a pulse of the processing laser beam so as to impinge upon said selected ones of said structures.

According to another embodiment, a method gathers data regarding the positions of structures to be selectively processed in a first portion of a substantially linear first row of structures on or within a semiconductor substrate by: generating a metrology laser beam and propagating the metrology laser beam along a propagation path that intersects the substrate at a metrology laser beam spot; moving the metrology laser beam spot relative to the semiconductor substrate along the first portion; and detecting reflections of the metrology laser beam off the structures in the portion as the metrology laser beam spot moves relative to the semiconductor substrate, thereby generating a reflection signal. Based on the gathered data, the method determines where to direct processing laser pulses onto the semiconductor substrate so as to impinge upon selected structures in a second portion of a substantially linear second row of structures on or within a semiconductor substrate, wherein said second row is substantially parallel to said first row.

As used herein: the term "on" means not just directly on but atop, above, over, or covering, in any way, partially or fully; the term "substantially" is a broadening term that means about or approximately but does not imply a high degree of closeness; and the term "adjacent" means next to or next in a series (e.g., the letter "F" is adjacent to "G" but not "H" in the alphabet) without implying physical contact.

Details concerning the construction and operation of particular embodiments are set forth in the following sections with reference to the below-listed drawings.

BRIEF DESCRIPTION OF THE DRAWINGS

FIG. 7 is an illustration of a segment of a link run across a number of link banks with a processing laser beam spot.

FIG. 8A is an illustration of a segment of a link run across a number of link banks with an alignment laser beam spot.

FIG. 8B is an illustration of multiple laterally spaced metrology link runs across a segment including laterally offset partial link-like structures for lateral metrology.

FIG. 8C is an illustration of a metrology link run across a segment including a reflection target designed to convey lateral metrology information.

FIG. 9A is an illustration of a segment of a link run across a number of link banks with both a processing laser beam spot and an alignment laser beam spot.

FIG. 9B is an illustration of a segment of a link run across a number of link banks with multiple processing laser beam spots and an alignment laser beam spot.

FIGS. 9E and 9F are illustrations of a segment of a link run across a number of link banks in the same row of links with a processing laser beam spot and an alignment laser beam spot.

FIG. 14 is a flowchart of a method according to one embodiment.

FIG. 15A is, a flowchart of a method according to one embodiment.

FIG. 15B is a the graph of FIG. 10 labeled to show a threshold for use with the method of FIG. 15A.

The drawings are meant to facilitate understanding of the principles described herein. As such, the drawings are not meant to depict scale or relative size accurately.

DETAILED DESCRIPTION OF EMBODIMENTS

With reference to the above-listed drawings, this section describes particular embodiments and their detailed construction and operation. The embodiments described herein are set forth by way of illustration only. Those skilled in the art will recognize in light of the teachings herein that variations can be made to the embodiments described herein and that other embodiments are possible. No attempt is made to exhaustively catalog all possible embodiments and all possible variations of the described embodiments.

For the sake of clarity and conciseness, certain details of components or steps of certain embodiments are presented without undue detail where such detail would be apparent to those skilled in the art in light of the teachings herein and/or where such detail would obfuscate an understanding of more pertinent aspects of the embodiments.

As one skilled in the art will appreciate, certain embodiments may be capable of achieving certain advantages over the known prior art, including some or all of the following: (1) greater positional accuracy delivering laser radiation to a selected structure; (2) less reliance on dedicated alignment targets; (3) more robust and less sensitive alignment; (4) simultaneous determination of both focus depth alignment and on-axis alignment; and (5) increased overall throughput. These and other advantages of various embodiments will be apparent upon reading the following.

Figure 1:
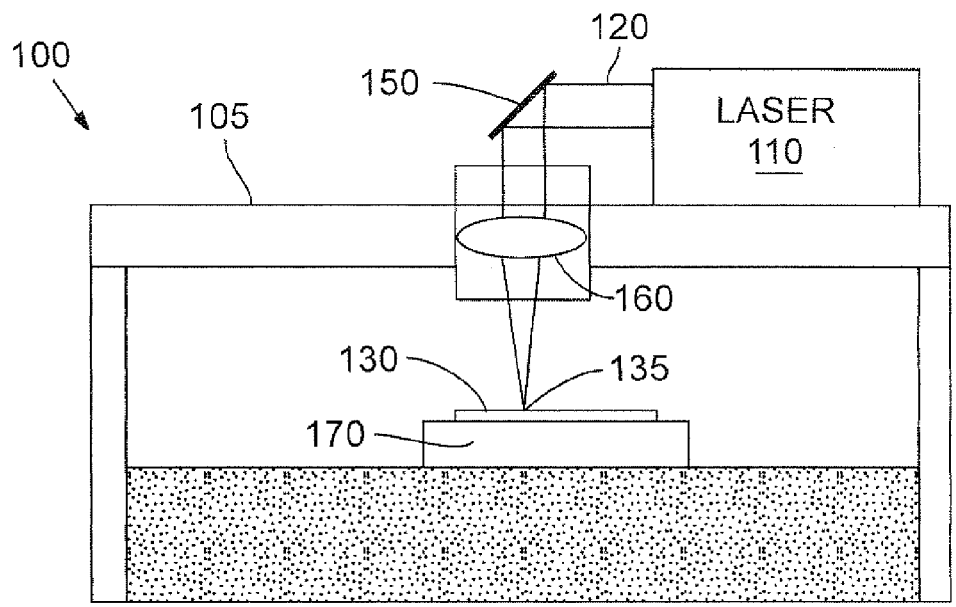
FIG. 1 is a simplified diagram of a link processing system.

FIG. 1 illustrates a typical link processing system 100. The system 100 comprises a laser 110, which produces a laser beam 120. The laser beam 120 propagates along a propagation path until it reaches a workpiece 130, which is typically a semiconductor wafer, at a laser beam spot 135. Disposed along the propagation path may be a number of optics elements, including a mirror 150 and a focusing lens 160. The position of the laser beam spot 135 on the workpiece 130 can be varied by moving the workpiece 130 in an XY plane (the laser beam 120 being incident upon the workpiece 130 in the Z direction) underneath a stationary optics table 105, which supports the laser 110, the mirror 150, the focusing lens 160, and possibly other optical hardware. The workpiece 130 can be moved underneath in the XY plane by placing it on a chuck (not shown) that is carried by a motion stage 170.

The motion stage 170 may be characterized by X-Y translation tables in which the workpiece 130 is secured to an upper stage that moves along a first axis and is supported by a lower stage that moves along a second axis perpendicular to the first axis. Such systems typically move the workpiece 130 relative to a fixed beam position of the laser beam spot 135 and may be referred to as stacked stage positioning systems because the lower stage supports the inertial mass of the upper stage which supports the workpiece 130. Such positioning systems can have desirable positioning accuracy because interferometers are typically used along each axis to determine the absolute position of each stage. This level of accuracy is preferred for link processing because the size of the laser beam spot 135 is typically only a little bigger than a link's width, so even a small discrepancy between the position of the laser beam spot 135 and the target link can result in incomplete link severing. In addition, the high density of features on semiconductor wafers results in small positioning errors potentially causing laser damage to nearby structures. Alternatively, in so-called split-axis positioning systems, the upper stage is not supported by, and moves independently from, the lower stage and the workpiece 130 is carried on a first axis or stage while optical elements, such as the mirror 150 and the focusing lens 160, are carried on the second axis or stage. Split-axis positioning systems are becoming advantageous as the overall size and weight of workpieces increase, utilizing longer and hence more massive stages. As yet another alternative, the motion stage 170 may be a planar positioning system, in which the workpiece 130 is carried on a single stage that is movable by two or more actuators while the optics and laser beam spot 130 remains in a substantially fixed position—or vice versa. Such systems translate the workpiece 130 in two dimensions by coordinating the efforts of the actuators. Some planar positioning systems may also be capable of rotating the workpiece, although that may not be necessary or desirable. Other alternative motion schemes position the laser beam spot 135 relative to the workpiece 130 by moving the laser beam spot 135 in one or more directions with actuated optics such as galvanometers or moving lenses and/or by moving the workpiece 130 in one or more directions. Regardless of its form, the motion stage 170 typically moves along a single axis, such as a row of links, at a time in a substantially straight path.

Figure 2:
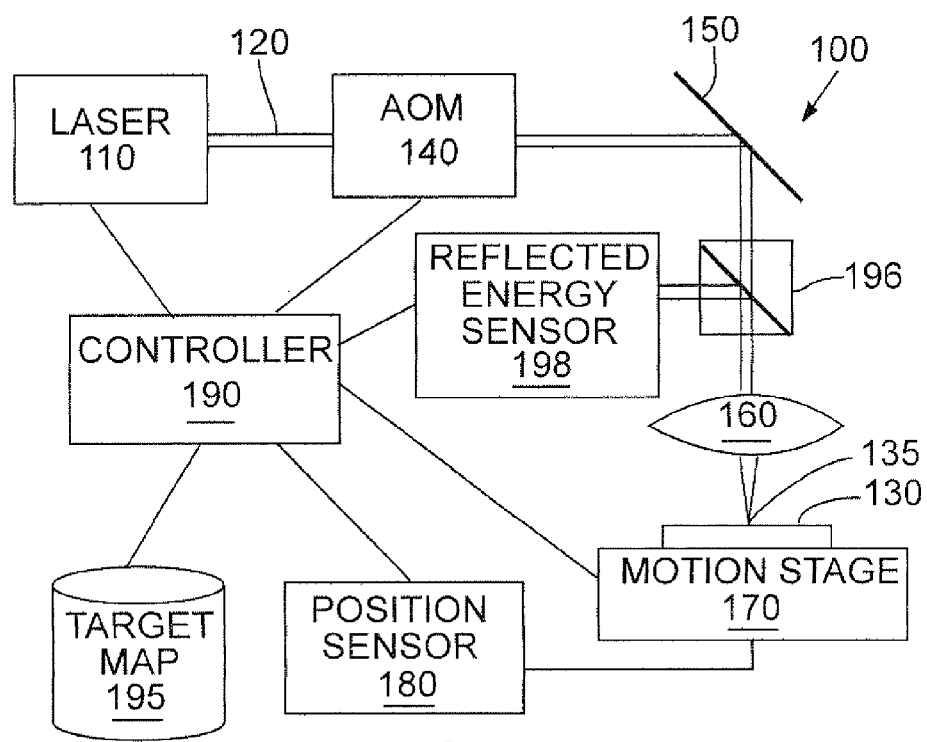
FIG. 2 is a block diagram of the link processing system of FIG. 1.

FIG. 2 is a block diagram of the link processing system 100. Along the propagation path of the laser beam 120 between the laser 110 and the workpiece 130 may be a number of optics elements, including an acoustic-optical modulator (AOM) 140, the mirror 150, and the focusing lens 160. The AOM 140 is responsive to a radio frequency (RF) input, which changes the direction in which the laser beam 120 exits the AOM 140. By selectively driving the AOM 140 with an RF signal having an appropriate amplitude and frequency, the AOM 140 can be configured to selectively block or pass the laser beam 120 to the mirror 150, through the lens 160, and onto the workpiece 130. In other words, the AOM 140 behaves like a light switch or shutter in the laser beam propagation path. It is additionally possible to use the AOM 140 in a partially transmitting state by driving the AOM 140 with RF power of reduced amplitude. This mode is useful for attenuating, but not completely blocking, the laser emissions that propagate along the laser beam propagation path.

Any device capable of functioning as a light switch or shutter can be used in place of the AOM 140. An electro-optic-modulator (EOM) and a liquid crystal modulator are examples of some such alternative devices.

A position sensor 180 (which may be one or more interferometers, encoders, or other means for sensing position) senses the location of the motion stage 170 and reports that position data to a controller 190 (which may be one or more computers, processors, circuits, etc.). The controller 190 uses calibration data to determine where the workpiece 130 is relative to the laser beam spot 135. The controller 190 also accesses a target map 195, which contains data indicating target positions on the workpiece 130 that should be irradiated (e.g., to sever a link at that position). The target map 195 is typically generated, for example, from a testing process that determines which circuit elements in the workpiece 130 are defective, logic that determines which links to process to disconnect defective elements and swap in redundant elements, and CAD (computer-aided design) data or other data indicating the nominal or expected positions of the links to be processed. The controller 190 typically choreographs the pulsing of the laser 110, the shuttering of the AOM 140, and the moving of the motion stage 170 so that the laser beam spot 135 traverses over each target and emits a laser pulse that reaches the workpiece 130 at the targets. The controller 190 preferably controls the system 100 based on position data, as that approach provides very accurate placement of laser pulses. U.S. Pat. No. 6,172,325, assigned to the assignee of the present invention and incorporated in its entirety herein by reference, describes laser-pulse-on-position technology.

As used herein, the phrase "laser beam spot" is actually a shorthand expression for the spot at which the axis of the laser beam's propagation path intersects the workpiece 130. To be precise, a laser beam is on sometimes and off sometimes. For example, the AOM 140 can block the laser beam 120 from reaching the workpiece 130. As another example, a pulsed laser beam is periodically on and off. Even when the laser beam is off, however, the spot at which the axis of the laser beam's propagation path intersects the workpiece 130 is always present and moves along the surface of the workpiece 130 as the motion stage 170 moves.

FIG. 2 also depicts a beam splitter 196 and a reflected energy sensor 198, which can be used during an alignment mode to collect reflected energy from the workpiece 130 and to measure that energy. In a typical X or Y alignment scan (sometimes referred to as beam-to-work (BTW) scans), the laser beam spot 135 is scanned across an alignment feature on the workpiece 130. The reflected energy sensor 198 may be, for example, a photodetector. The reflection off the workpiece 130 passes through the beam splitter 196 to the reflected energy sensor 198, which conveys its readings to the controller 190. The reflected energy readings correspond to numerous position coordinates from the position sensor 180 or from position commands sent to the motion stage 170. Differences in the received reflected power when the laser spot falls upon the alignment feature, and the area surrounding the alignment feature, are interpreted by the controller 190, along with the position coordinates, to deduce the location of the alignment feature in the coordinate system of the position sensor 180 or the motion stage 170. Typically, the alignment feature is more highly reflective than the area surrounding the alignment feature, resulting in increased optical power received by the reflected energy sensor 198 when the laser beam spot 135 overlaps with the alignment feature. Comparison of the feature location determined through the alignment scan process with reference positional data indicating the target location (e.g., the target map 195 or CAD data) can be used to calibrate the location, scale, rotation, skew, tilt, warpage, pincushion distortion, and/or other planar or higher order (i.e., three dimensional) calibration terms concerning the location of the workpiece 130 or the target in the coordinate system of the laser processing system 100. U.S. Pat. No. 4,941,082, which is incorporated herein by reference, describes some higher-order calibration techniques. As used herein, the term "alignment" encompasses X or Y alignment (or both), Z depth focusing, and all other types of positional or spatial orientation or calibration.

Note that it is immaterial whether the laser 110 and its associated optics are stationary and the workpiece 130 moves, or vice versa, or some combination of movement by both bodies occurs. All that is required is the laser beam spot 135 and the workpiece 130 move relative to one another. For example, as one alternative to what is shown in FIGS. 1 and 2, the position of the laser beam spot 135 can be varied over the workpiece 130 by holding the workpiece 130 still while moving the optics hardware on the optics table 105. In that case, a motion stage like the motion stage 170 may be provided to move the pertinent optics hardware on the optics table 105, typically in substantially straight X-Y directions. As another alternative, both the optics hardware and the workpiece 130 can be moved to provide relative motion between the laser beam spot 135 and the workpiece 130. As another alternative, the optics table 105 and the workpiece 130 may be still, while steering mirrors are used to move the laser beam spot 135 along the workpiece 130. As another alternative, a motion stage may be used to move the pertinent optics on the optics table 105 in one direction, such as the X direction, and the motion stage 170 may move the workpiece 130 in another direction, such as the Y direction, to provide relative motion between the laser beam spot 135 and the workpiece 130.

Note also that the purpose of the laser irradiation could be anything, not just link blowing. The purpose of the irradiation may be to drill, machine, trim, sever, scribe, mark, cleave, make, heat, alter, diffuse, anneal, or measure a structure or its material. For example, laser radiation can induce a state change in a structure's material, cause the migration of dopants, or alter magnetic properties—any of which could be used to connect, disconnect, tune, modify, or repair electrical circuitry or other structures.

Figure 3:
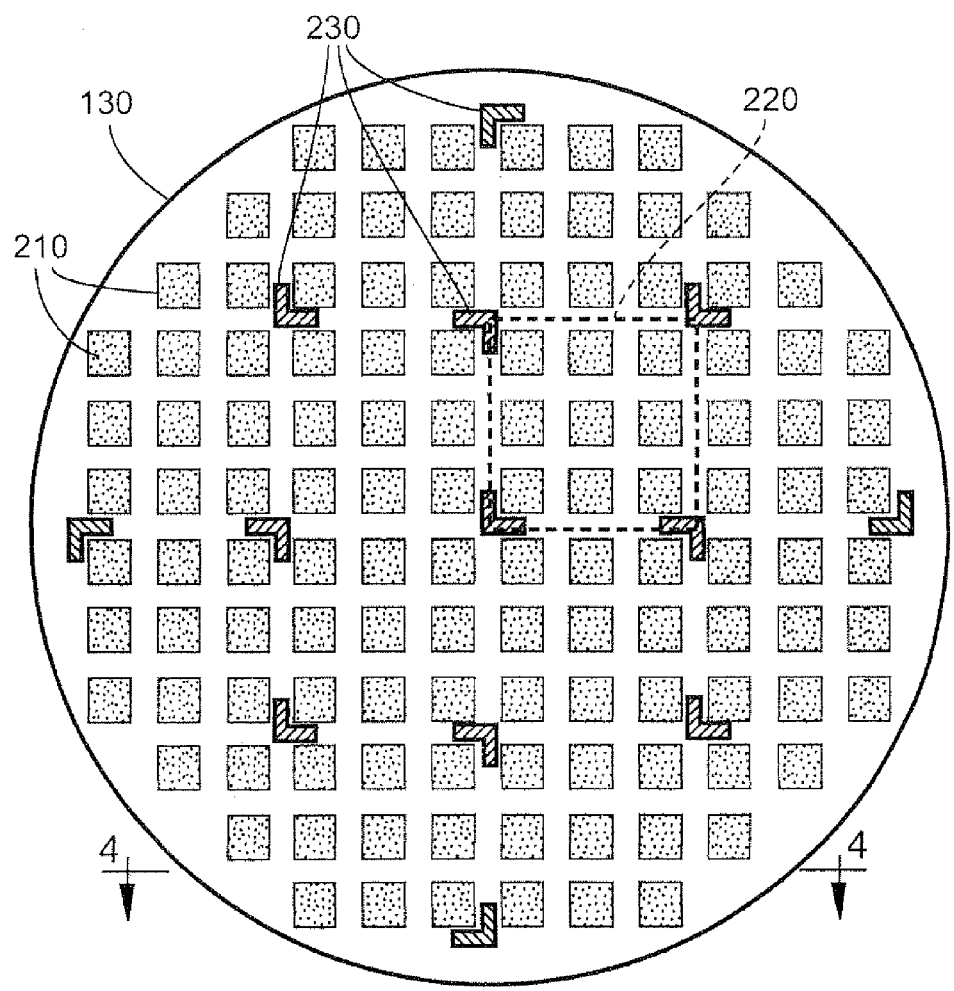
FIG. 3 is top view of a semiconductor wafer.

FIG. 3 is a top view of a semiconductor wafer, which is the most typical form of the workpiece 130. This workpiece 130 contains a number of dies 210, which are generally laid out in a regular geometric arrangement. A group of contiguous dies in a typically rectangular pattern constitutes an alignment region 220, at or near the corners of which are dedicated alignment targets 230. There may be additional alignment targets (not shown) on or near each die. As mentioned above, the alignment targets 230 can be used to align the laser beam spot 135 to the workpiece 130. Alignment data gathered from the alignment targets 230 in each corner of an alignment region 220 can be used to calculate the positions of links to be processed within each die in the alignment region. For example, surface fitting algorithms can be applied to the known corner alignment target data to fit a surface model to the alignment region. This process is commonly referred to as position geometry correction (PGC). While such techniques are useful, they are also suffer from the following fundamental limitations: (1) the dedicated alignment targets are limited in number and (2) the alignment targets are at best indirect indicators of the positions of the links in the interior of the alignment region 220. For example, a dust particle underneath the alignment region 220 may cause the workpiece 130 to deflect in a way that alters the Z heights of certain interior structures but does not alter the Z heights of the alignment targets.

Figure 4:
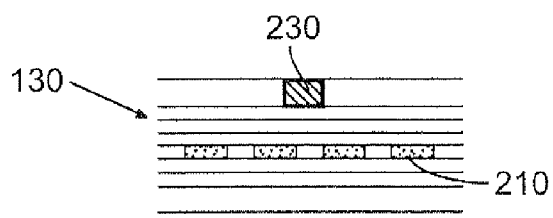
FIG. 4 is a side view of the semiconductor wafer of FIG. 3.

FIG. 4 is a side view of the same workpiece 130. FIG. 4 illustrates the fact that the alignment targets 230 may be, and in fact typically are, on a different layer of the workpiece 130 and therefore at a different Z height from the links in the dies 210. This Z offset can complicate alignment in the Z dimension (i.e., focusing). Either the offset must be accounted for or some misalignment in the Z direction must be tolerated. In some cases where the layers of the workpiece 130 vary in Z thickness as a function of lateral X-Y position, it may be impossible to properly account for thickness variations based upon alignment and focus data from the dedicated alignment targets 230.

Figures 5A, 5B, 5C:
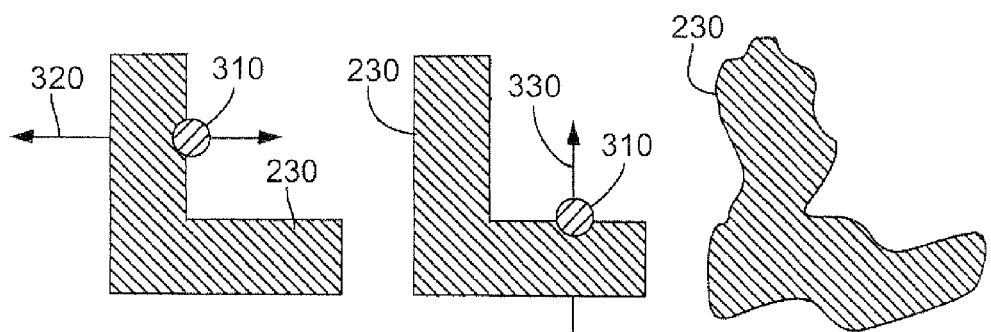
FIGS. 5A and 5B are illustrations of alignment operations using dedicated alignment targets.
FIG. 5C is an illustration of a malformed dedicated alignment target.

FIGS. 5A and 5B are illustrations of alignment operations using a dedicated alignment target 230. In FIG. 5A, an alignment laser beam spot 310 traverses back and forth across the alignment target 230 in an X alignment path 320. The beam spot 310 traverses this path 320 at a number of different focusing heights, and the focusing height producing the sharpest edge transitions is used to register the edge positions of the alignment target 320. In FIG. 5B, the same process is repeated in the Y direction along a Y alignment path 330. When the alignment target 320 is malformed, however, as shown in exaggerated form in FIG. 5C, then the position data produced from scanning the alignment target 220 may be flawed.

Although the alignment paths 320 and 330 may not be perfectly straight, they are preferably substantially straight, resulting from essentially straight-line motion of the workpiece 130 and/or the alignment laser beam spot 310. Any rotational or angular movement of the workpiece 130 about its center or approximate center during the alignment operations is preferably negligible and ideally zero. Although relative straight-line motion of the workpiece 130 and/or the alignment laser beam spot 310 can be accomplished by a combination of rotation about the center of the workpiece 130 and radial movement of the alignment laser beam spot 310, that is preferably not the dominant movement mode. Any rotational velocity of the workpiece 130 about its center during an alignment operation is preferably less than the local absolute speed of the alignment laser beam spot 310 relative to the workpiece 130 divided by the distance from the center of the workpiece 130 to the alignment laser beam spot 310.

Figure 6:
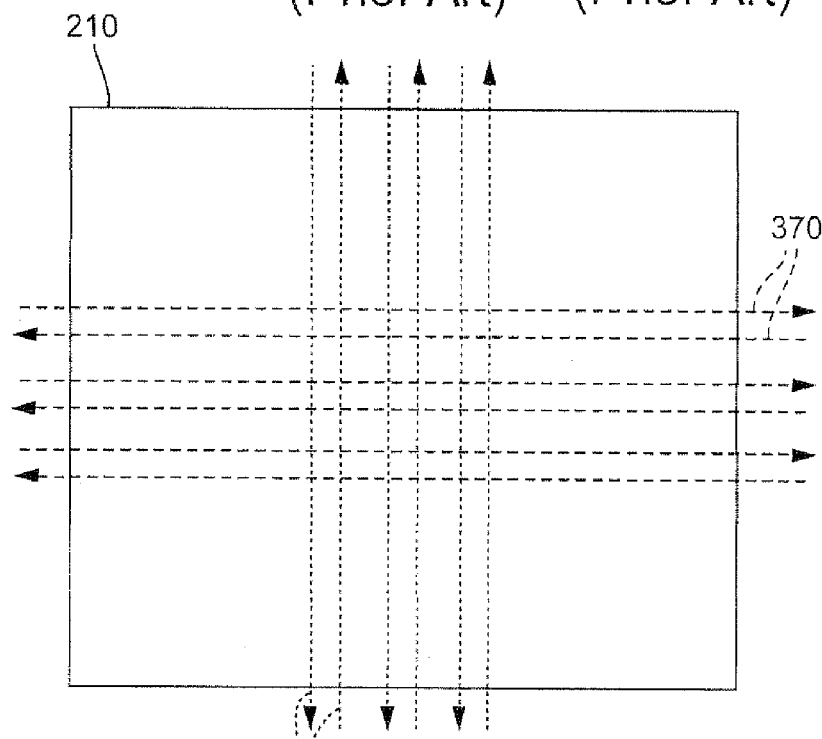
FIG. 6 is an illustration of link runs across a semiconductor die.

FIG. 6 is an illustration of link runs across a semiconductor die 210. Both X direction link runs (along the X direction trajectories 370) and Y direction link runs (along the Y direction trajectories 380) are shown. Circuit elements within a given die (which are typically all the same on a given wafer) are typically arranged in a regular geometric arrangement, as are the links between those elements. The links usually lie in regular rows in groups which are termed "link banks," having an approximately uniform center-to-center pitch spacing and extending in orthogonal X and Y directions. To remove selected links in a link bank, the beam spot 135 continuously advances along the link bank at an approximately uniform speed while the laser 110 emits pulses to selectively remove links. The laser 110 is triggered to emit a pulse and thereby to sever a link at a selected target position when the laser beam spot is on the target position. As a result, some of the links are not irradiated and left as unprocessed links, while others are irradiated to become severed or otherwise physically altered. The process of progressing across some or all of the workpiece 130 and processing selected links with laser radiation is termed a "link run," more particularly a "processing link run" (or simply "processing run"), which typically are in either the X direction or the Y direction.

As a laser beam spot moves relative to the workpiece 130, the laser beam spot traverses a laser beam spot scan path on or within the workpiece 130. This scan path can take many forms. As illustrated in FIGS. 5A and 5B, during beam-to-workpiece alignment scans, the scan paths are short linear segments back and forth across the dedicated alignment target 230, typically at varying depths, which together may be jointly considered a single scan path. As illustrated in FIG. 6, scan paths for link runs are typically straight segments in either the X or Y direction across one or more dies 210, perhaps even across the entire diameter of the workpiece 130. Again, each such segment can be considered to be a scan path, or some or all of an entire sequence of such segments can be considered to be a single scan path, in which case the velocity profile of the scan path can be said to include stops. In usual circumstances, however, a scan path has a length no longer than the diameter of the workpiece 130 between stops or other path alterations. Note also that typical scan paths produced by a linear X-Y motion stages do not encircle the center of the workpiece 130. A scan path may include a Z component as well.

The movements necessary to accomplish the link runs are preferably straight translational movements in the X or Y directions, with no more than negligible rotational component. Any rotation of the workpiece 130 about its center during a link runs is ideally zero and at least preferably less than the local absolute X or Y displacement divided by the distance from the center of the workpiece 130 to the laser beam spot.

FIG. 7 is a more detailed illustration of a segment of a link run along a link run trajectory 370 across a number of link banks 420. Each link bank 420 consists of a number of more-or-less regularly spaced links 410, which have a length extending in a lengthwise direction. The link run trajectory 370 is preferably at least approximately orthogonal to the links' lengthwise direction and therefore parallel to the link row. Gaps 430 may exist between link banks 420, as shown. As the laser beam spot 135 moves along the link row during the link run, the laser beam is selectively turned on to reach the workpiece 130 and thereby sever or otherwise alter selected links in accordance with a processing plan (e.g., memory defect repair plan to disconnect defective memory cells and connect or leave connected redundant ones in their place). For example, as shown in FIG. 7, the second and third links in the link bank 420B have been severed, while the first, fourth, and fifth links have been left intact.

The most efficient path traversed by the laser beam spot during a link run is one straight and perfectly parallel to the direction of the link row, as illustrated by the link run trajectory 370. However, other trajectories are possible. For example, an angled link run trajectory 372 is not perfectly parallel to the direction of the row of links but is offset by a small angle. As another example, a curvy link run trajectory 374 oscillates, dithers, or otherwise varies in the Y direction during the course of the X-direction link run. As yet another example, a arcuate link run trajectory 376 is possible, as might occur when the workpiece 130 undergoes a small rotational movement during the link run. In any event, the direction of the link run trajectory is predominantly along the length of the link row (or, put differently, perpendicular to the lengthwise directions of the links).

Accurate processing of the links 410 depends upon accurate positioning of the laser beam spot 135 on the links 410 at the appropriate time when a laser pulse is delivered by the laser 110. Positional and focusing accuracy is becoming increasingly important as the required tolerances for focus and position continue to shrink on semiconductors due to smaller focused spot sizes, smaller links, and tighter link pitches.

The present inventor has realized that positioning can be improved by using the links 410 themselves as metrology targets in place of or in addition to the dedicated alignment targets 230. One version of this approach is illustrated in FIG. 8A, which shows a metrology laser beam spot 535 traversing a link row along one of the link run trajectories 370, 372, 374, or 376. According to this version, the link run trajectory may be any trajectory that has a predominant component in the direction of the link row; however, for the sake of clarity and not by way of limitation, only the link run trajectory 370 will be illustrated and discussed hereafter in this document. As the alignment laser beam spot 535 moves over and between the links 410, the reflection pattern is measured and can be used to perform alignment, at least in the X direction of the link run and/or in the Z direction. A similar operation can be performed along a Y direction link run trajectory 380 to perform alignment in that direction as well. By this method the X, Y, and Z positions of the links 410 and/or the workpiece 130 relative to the metrology laser beam spot 135 may be determined. It may also be useful to perform an alignment scan of links in a row in one direction, then perform an alignment run of some or all of the same links in the opposite direction. Opposing scans may be able to further refine the calibration or identify directional dependencies in the underlying metrology data or in the data gathering methodology.

One way to use the metrology data gathered from the links 410 is to use it to update mathematical models utilized for alignment and focus. For example, data gathered from alignment scans can be used to update PGC models of alignment and focus fields. Various mathematical models are also possible. Iterative or recursive refinement of the models based upon some new data and some older data are also useful techniques. Once models have been generated, link coordinates can be mapped using the models as a way to properly process link coordinates. Alternatively, if focus and lateral calibration data are scanned off link banks nearby the links to be processed, then mathematical models may be unnecessary, as one can just utilize the XY offsets or Z heights of the nearest scan. This technique can be applied by scanning every link and link bank for calibration information. It can also be applied by scanning some links and link banks so that data exists near every link, for example within 1-2 mm laterally of each link location.

Alternatively, a metrology run can be performed every so often, e.g., every 30 seconds. The time period between metrology runs can be chosen based on such system parameters as thermal drift characteristics. Link processing systems, such as the link processing system 100 (FIGS. 1 and 2), typically experience slight positional drifts over time, usually attributable to thermal expansion and/or contraction of physical components or thermal drift of sensor response. By performing a metrology run periodically, the system can refine its calibration before the positional drifts become so great that they affect the accuracy of processing.

The metrology laser beam spot 535 may be the same as the processing laser beam spot 135, as the same laser can be used for both metrology and processing. One technique for doing so is to operate the laser 110 in a continuous wave (CW) mode during a metrology run and to operate the laser 110 in a pulsed mode during a processing run. According to that technique, metrology runs can be interspersed with processing runs as desired to collect metrology data. It may even be possible to switch laser modes between metrology and processing modes during the same link run. Alternatively, two distinct laser beams may have the same or substantially overlapping laser beam spots, one of which may be used for metrology and the other for processing.

Alternatively, some versions of the laser 110 (e.g., fiber lasers) may be made to leak a small amount of CW energy for alignment while operating simultaneously in a pulsed mode for processing. The low-energy CW beam may have one or more optical characteristics (e.g., polarization or wavelength) to differentiate its reflection from that of the pulsed processing laser beam. If the metrology and processing laser beams have different wavelengths, an appropriate optical filter before the reflected energy sensor 198 can be utilized to attenuate reflection of the processing beam while passing reflection of the metrology beam. In other cases, the optical characteristics may be unchanged, letting the system 100 tolerate occasional erroneous alignment reads caused by processing of a link. By averaging over a sufficient number of links, those occasional erroneous metrology reads become insignificant. Alternatively, known bad metrology reads can be simply ignored. A metrology read may be known to be bad due to (1) measurement of a much higher than usual reflection (caused by the processing laser beam reflecting off the link) or (2) knowledge that a particular link is targeted to be processed. Because only about 10% of links are typically processed on a given semiconductor wafer, there are in almost all cases sufficient unprocessed links to serve as reliable metrology targets according to the techniques described herein.

The laser described in U.S. Pat. No. 6,593,542 can also be used to perform processing and link-based metrology as described herein. That laser is capable of producing both a UV (ultraviolet) beam for processing and a green or IR (infrared) beam for metrology. The techniques described herein may be utilized with any wavelength of laser radiation, including, for example, IR, visible, and UV wavelength ranges, specifically including about 1.34 µm (micrometers, microns or $10^{-6}$ meters), about 1.064 µm, about 1.047 µm, about 532 nm (nanometers or $10^{-9}$ meters), about 355 nm, and about 256 nm.

Yet another technique for producing an alignment laser beam from the same laser used for link processing is the rapid pulsing technique described in U.S. patent application Ser. No. 10/931,460. According to that technique, the Q switch of a Q-switched laser is alternately opened and closed at a rapid rate so that the laser emits more rapid, less energetic pulses than normal pulsed mode operation. If the pulse rate is sufficiently high, less laser energy reaches the workpiece 130 so that metrology can occur without appreciable damage to the workpiece 130. The AOM 140 can also be commanded to attenuate the amplitude of the laser energy that reaches the workpiece 130. Pulsed BTW metrology typically involves synchronizing reads of reflectivity data with the generation of the pulses.

When using a pulsed laser for both processing and metrology, the laser 110 and the AOM 140 can be operated to intermix the states of high pulse energy reaching the workpiece 130 for processing and lower energy reaching the workpiece 130 for metrology. This may be accomplished with a link run by varying the laser 110's pulse repetition rate and the AOM 140's attenuation levels, as described above.

In another embodiment, the metrology laser beam spot 535 and the processing laser beam spot 135 may be distinct and separate. If the offset between the metrology laser beam spot 535 and the processing laser beam spot 135 (not shown in FIG. 8A) is known, that offset can be taken into account when positioning the processing laser beam spot 135 for operation. This may be the case, for example, when the two beams, although produced from the same laser, have different or divergent propagation paths, perhaps due to optical processing differences (e.g., polarization or wavelength). This can also occur when two or more lasers are employed to produce one or more metrology beams and one or more processing beam simultaneously. Methods and systems for producing multiple laser beams are disclosed in U.S. patent applications Ser. Nos. 11/051,265, 11/051,262, 11/052,014, 11/051,500, 11/052,000, 11/051,263, 11/051,958, and 11/051,261, which are incorporated herein by reference. Those applications teach techniques for using multiple laser beam spots to process multiple links in various parallel configurations, including "on-axis" (in which the spots are distributed in the direction of the link run), "cross-axis" or "lateral" (in which the spots are distributed in the direction perpendicular to the link run trajectory) and hybrids. The same arrangements of beam spots can be utilized with one or more of the beam spots being metrology beam spots.

In some cases the metrology beam can measure cross-axis Y data as well as on-axis X data. For example, FIG. 8B is an illustration of multiple laterally spaced metrology link runs along trajectories 370A, 370B, and 370C across a segment of links including laterally offset partial link-like structures 440. The laterally offset partial link like structures 440 may be placed in a gap 430 as shown. Scanning laterally offset metrology beam spots 535A, 535B, and 535C across the structures 440 (either scanning with the same beam serially with a progressive lateral offset for each scan, or scanning with multiple beams in parallel as shown) provides cross-axis metrology information. For example, the middle beam spot 535B produces a reflection off the middle structure 440, while the top beam spot 535A produces a reflection off only the first (leftmost) structure 440, and the bottom beam spot 535C produces a full reflection off only the third (rightmost) structure 440. Depending upon the arrangement of the structures 440, the number, order, and/or timing of the reflections off the structures 440 conveys information about the lateral position of the metrology beam spot 535. More or fewer structures 440 can be utilized; the number and arrangement of the structures 440 in FIG. 8B merely illustrates the concept. If the metrology beam spot 535 is steerable in the Y (cross-axis) direction, dithering the Y position of the beam spot 535 during a single link run can also produce Y metrology information.

Other arrangements of multiple metrology laser beam spots are possible, such as for example, multiple on-axis spots, multiple cross-axis spots on separate generally parallel link runs, cross-axis offset within the same link run as shown in one illustrative form in FIG. 9B, and hybrids of some or all of the above. Such other arrangements of multiple metrology laser beam spots may be for the purpose of collecting Y position data, collecting X position data for different rows of links simultaneously, or other purposes.

FIG. 8C depicts a metrology link run that collects data from both target links 410 and also alignment structures 444. The alignment structures 444 intermixed in the metrology link run may have any shape, including traditional alignment targets. The specific alignment structures used in FIG. 8C enable an alternative way to collect Y metrology information during a link run in the X direction. The gap 430A between the link banks 420A and 420B contains an alignment structure 444 having two triangular reflective sections separated from one another by a non-reflective break that extends across the structure 444 at an angle such that the X position of the break conveys information about the Y position of the metrology laser beam spot 535. In particular, as the metrology laser beam spot 370 scans across the alignment structure 444, the reflection signal will consist of a first large magnitude reflection signal for a first duration, followed by a small magnitude (ideally zero) reflection signal over the break, followed by a second large magnitude reflection signal for a second duration. The first duration and/or the second duration convey information about the Y position of the metrology laser beam spot 535. Optionally, the alignment structure 444 can consist of only a single triangular reflective section, as one such section alone can provide the desired Y positional information; however, two such sections in the arrangement shown in FIG. 8C better utilize the available space in the gap 430A and can provide more reliable Y positional information via redundancy.

FIG. 9A shows one desirable on-axis arrangement in which the leading beam spot is the metrology beam spot 535 and the trailing beam spot is the processing beam spot 135. As this row of links is processed, metrology measurements are gathered from the metrology laser beam spot 535 and the measured data is processed to determine a precise location for the following processing laser beam spot 135 to process that link. Optionally, one or more additional trailing processing and/or metrology beam spots may also be used, as shown in FIG. 9B. Although it is preferred that the metrology laser beam spot 535 lead and the processing laser beam spot(s) 135 trail, as shown in FIG. 9B, it is also possible that the processing laser beam spot(s) lead and the metrology laser beam spot(s) trail.

Figure 9C:
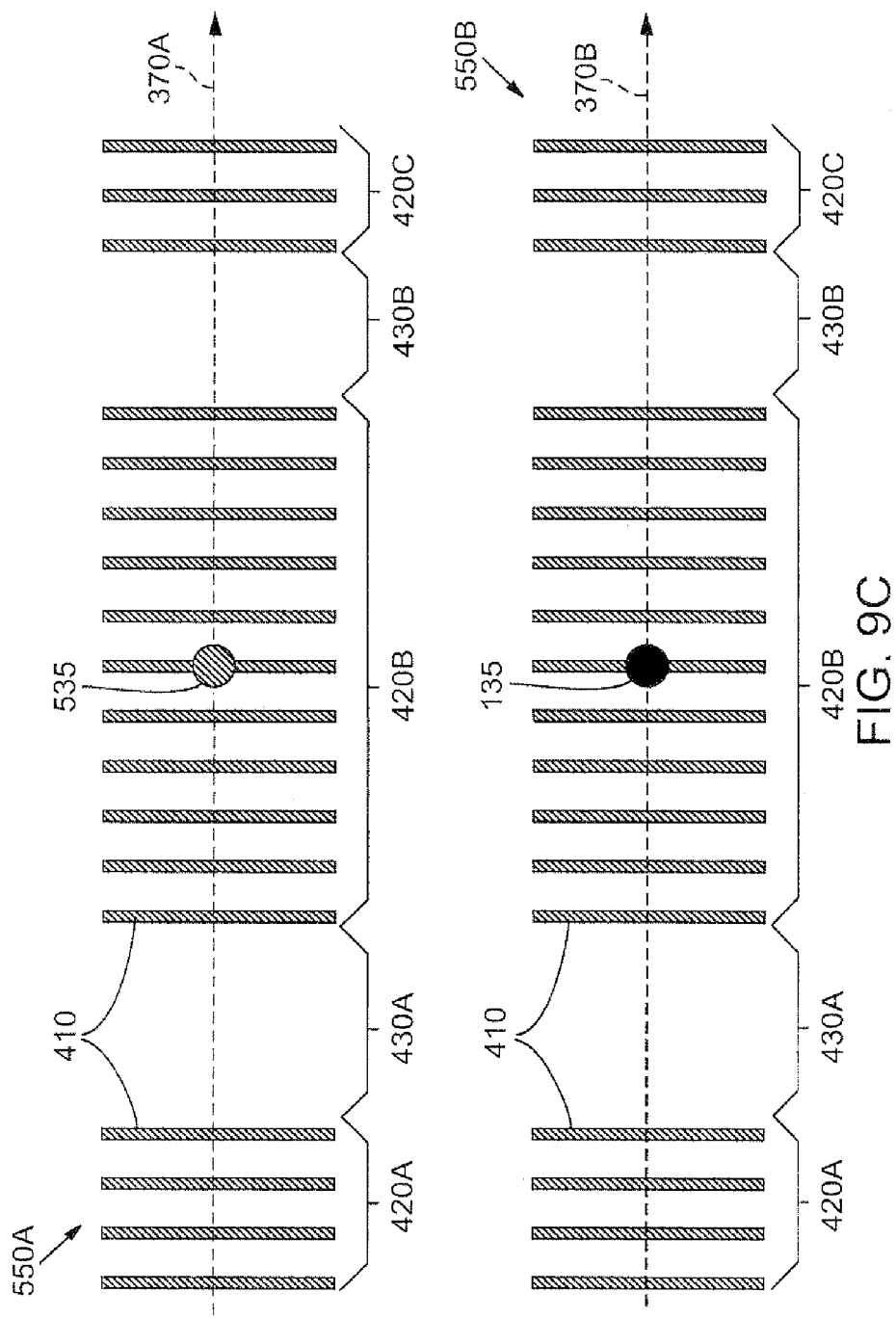
FIGS. 9C and 9D are illustrations of a segment of a link run across a number of link banks in one row of links with a processing laser beam spot and a segment of a parallel link run across a number of link banks in a nearby row of links with an alignment laser beam spot.

FIG. 9C illustrates a cross-axis arrangement of a metrology spot 535 and an processing spot 135. The metrology spot 535 traverses along a first row of links 550A, and the processing spot traverses along a second row of links 550B, which is generally laid out parallel to and preferably nearby the first row 550A (e.g., the next closest or neighboring row). Due to the typical rectilinear regularity of semiconductor IC layouts, the link positions measured by the metrology spot 535 in the row 550A correlate closely to the positions of the links being processed by the processing spot 135 in the nearby row 550B. Any known offsets, which may be determined for example from CAD and/or other alignment data, can be taken into account in the on-axis, cross-axis, and vertical Z directions.

Figure 9D:
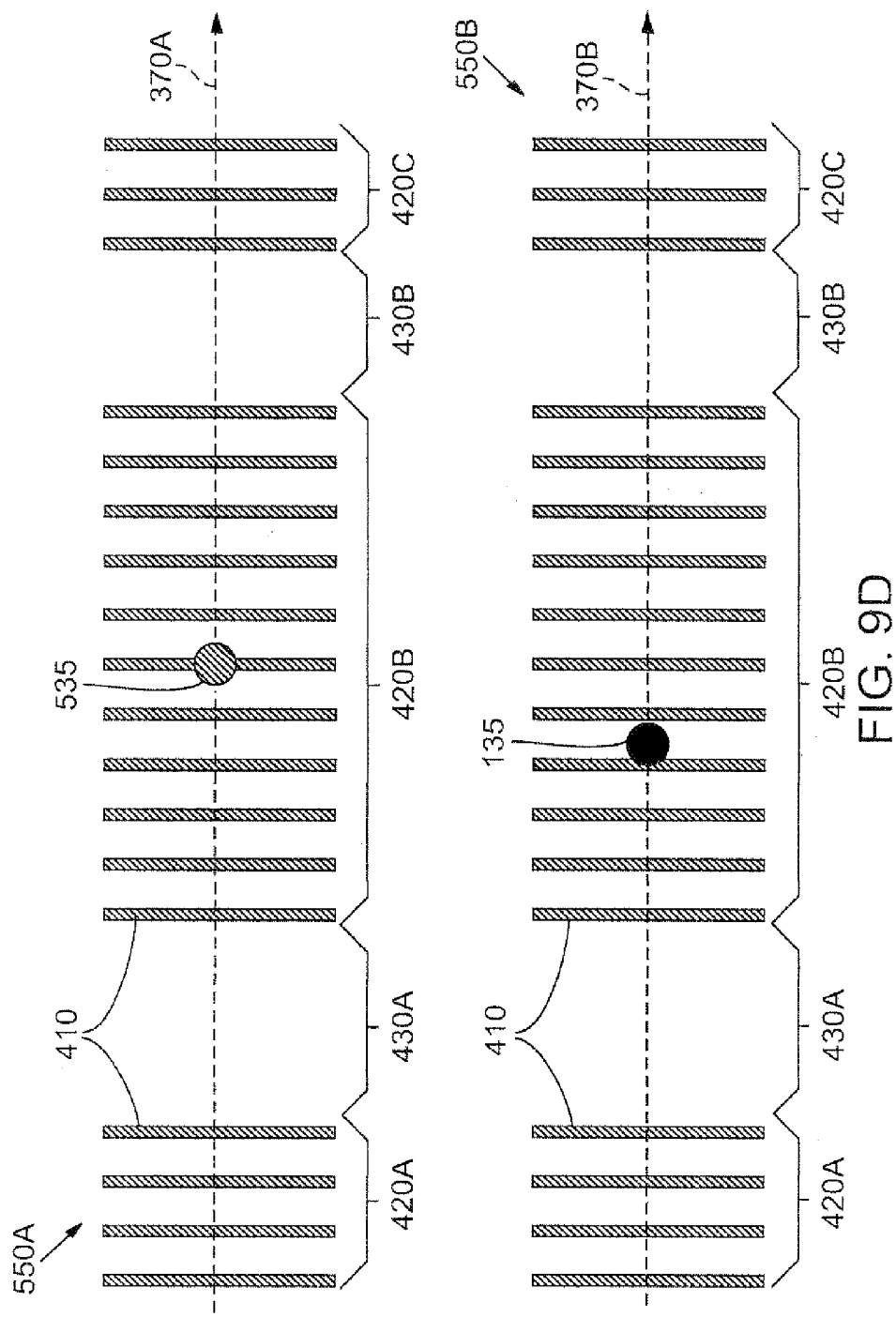

FIG. 9D illustrates a cross-axis arrangement of a metrology spot 535 and a processing spot 135 with an on-axis offset. As shown, the metrology spot 535 in the first row 550A leads the processing spot 135 in the second row 550B by some amount in the on-axis or X direction.

FIG. 9E illustrates a cross-axis arrangement of a metrology spot 535 and a processing spot 135 within the same row. The metrology spot 535 and the processing spot 135 are separated from each other by some amount in the Y direction as they travel in the X direction along respective trajectories 370A and 370B.

FIG. 9F illustrates a cross-axis arrangement of a metrology spot 535 and a processing spot 135 with an on-axis offset within the same row. The metrology spot 535 and the processing spot 135 are separated from each other by some amount in the Y direction and some amount in the X direction as they travel in the X direction along respective trajectories 370A and 370B. One advantage of this arrangement compared to the pure cross-axis arrangement of FIG. 9E or the pure on-axis arrangement of FIG. 9A is increased spatial separation between the processing spot 135 and the metrology spot 535. One advantage of this increased spatial separation can be lessening of interference by the processing laser on the metrology process.

Performing alignment using the links 410 can be more accurate than utilizing the dedicated alignment targets 230 alone for several reasons, including (1) decreased sensitivity to flaws in the dedicated alignment targets 230, (2) closer spatial correlation between the alignment targets and the processing targets in the X, Y, and/or Z directions, and (3) the ability to average over a large number of alignment measurements collected quickly. The following paragraphs elaborate upon those advantages.

First of all, the dedicated alignment targets 230 are typically quite sparse on the workpiece 130. A typical semiconductor DRAM die has an area of approximately 70 mm$^2$, contains about 2,000 to about 20,000 links, but only typically contains 2-4 dedicated alignment targets 230. If a dedicated alignment target 230 is defective (as shown in FIG. 5C), one must travel a relatively long distance to find an alternative dedicated alignment target that may be satisfactory. Also, there may not be a dedicated alignment target near to all of the links 410 that need to be processed, so guesswork about the XY alignment and Z focus height must occur. Fine features, such as vertical displacements that occur due to a particle under the wafer, may also be missed. However, these and other fine features can be captured by taking more measurements closer together. The techniques described herein take measurements at various points on the workpiece 130, wherein the density of such measurement points is preferably within at least one or two orders of magnitude of the density of links on the workpiece 130. In fact, link-based alignment can in some instances obviate the need for dedicated alignment targets 230, thereby freeing valuable real estate on the workpiece 130 and reducing complexity of the workpiece 130 and its fabrication processes, such as layout and mask creation. Moreover, link-based alignment can facilitate processing individual dies 210 after they have been cut from a wafer.

Secondly, it is fundamentally not as accurate to scan at the corners of an alignment region 220 and then make inferences about the interior of the region 220 using mathematical models. Taking measurements at or near where the processing will occur is more accurate. The links 410 are the closest optical targets at or nearby the location of the links to be processed. On a related note, focusing on the links 410 is also more accurate than bouncing a beam off the surface of the workpiece 130 or the dedicated alignment targets 230 for focus height determination due to variations in the thicknesses of the intervening layers. Those thickness variations may be uniform across the wafer, or may have a location dependence.

Third, scanning a row of many links 410 allows quick data capture of multiple targets, averaging of many target locations, and a redundancy that eliminates problems due to defective targets. A great quantity of alignment data can be quickly captured off a row of successive links. This fast data capture is possible because data can be recorded while the motion stage 170 moves continuously in one direction, predominantly in one of the X or Y direction. In fact, in some cases it may be possible for the motion stage 170 to move at regular processing speeds while metrology data is collected from the links 410. In other words, the metrology can occur "on the fly," without incurring any significant throughput penalty for alignment. In some cases, the motion stage 170 can move one or more orders of magnitude faster during a processing run than when scanning a dedicated alignment target 230. Presently, typical speeds at which a laser beam spot moves relative to the workpiece 130 during a link run range from about 40 mm/s to about 200 mm/s, as compared to typical speeds of about 5-20 mm/s at which a laser beam spot is conventionally scanned across the dedicated alignment target 230.

Moreover, it is impractical to place many alignment targets in a row in the interior of a die because of the extremely valuable workpiece area they would occupy, but using the naturally occurring rows of links as alignment targets can enable copious data capture, and measuring the location of many links allows one to average the location of tens, hundreds, or even thousands of target locations together to get a position estimate. Furthermore, the problems caused by a defective dedicated alignment target 230 are mitigated using the links 410 as alignment targets. A defective dedicated alignment target 230 may be incapable of providing an accurate reference signal, regardless of how many times it is scanned. In contrast, if the locations of many different links 410 are assessed and averaged, the impact of a few defective targets is minimal.

Figure 10:
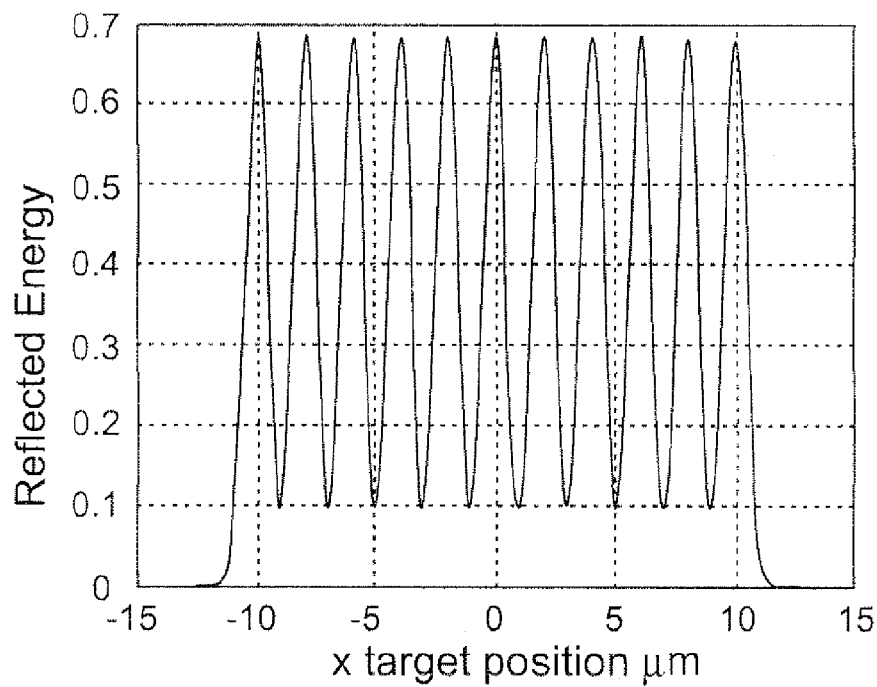
FIG. 10 is a graph of reflected alignment laser energy as a function of X position across the middle link bank of FIG. 8 or 9.

FIG. 10 is a graph of reflected alignment laser energy as a function of X position across the middle link bank 420B of any of FIG. 8 or 9. FIGS. 10-13 were produced by simulation assuming that the links 410 in this bank 420B have a uniform width of 0.75 microns and a uniform pitch of 2 microns and that the beam spot has a Gaussian spatial distribution with a $1/e^2$ diameter of 1.5 microns. These numerical values, while presently representative, were chosen for the sake of illustration. At present, link pitch typically ranges from about 1.8 to about 3 microns. Thus, the techniques described herein take metrology measurements at distinct points on the workpiece 130 separated by a spacing that is the same as or at least on the same order as the link pitch. As noted already, these values are expected to shrink in the future. At the time of this writing, small-spot UV laser processing is expected to facilitate a reduction in link pitch, which will require greater system accuracy. The required accuracy improvements are primarily in the on-axis and Z height directions, which are the easiest directions ascertained through metrology link runs.

A single swipe of the alignment laser beam spot 535 down the link bank 420B can quickly and efficiently gather a set of spatially dense position and reflection measurements that can be used for alignment. This reflection data can be used to determine the on-axis relationship between the beam waist and the target links 410. FIG. 10 shows that there are 11 maxima and 10 minima in the reflection signal. Maxima can be used to locate links; minima can be used to locate the center of the spaces between links (average location of two adjacent links). Thus, application of a peak finding algorithm to this reflection signal and CAD data of link coordinates can generate 21 estimates of laser-link alignment. Curve fitting to a reflectivity model, rather than using a peak finding algorithm, may provide greater accuracy.

Averaging the results of multiple located peaks may determine the spot-link alignment with better resolution than present measurements of one target for two reasons: First, the quick capture of serialized reflectivity signals allows the capture of many more reflection peaks than traditional repetitive scans of a single target in the same amount of time. Second, the impact of a defective link in the midst of a row of many perfect links can be reduced through averaging.

These methods are applicable to banks of links of any length. The links 410 may have uniform spacing and width, or may have a non-uniform spacing and/or a non-uniform width. These methods may be applied to multiple banks of links with gaps of even or varying sizes between the banks.

Figure 11:
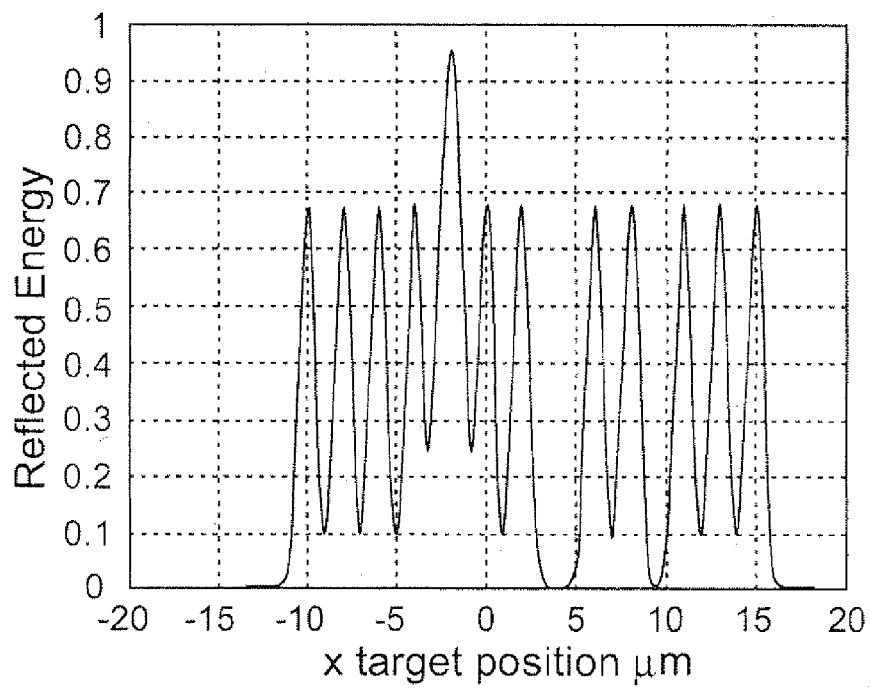
FIG. 11 is a graph of reflected alignment laser energy as a function of X position across a link bank having a synchronization pattern.

In some cases additional information may be required to correlate the reflection signal produced by a segment of links with the CAD location for the correct links. For example, reflection data out of the center of a very long string of identical links with identical spacing may not indicate which link produced which reflection. Thus calibration may be off by integer multiples of the link spacing. Synchronization or correlation techniques can be employed to definitively overlap reflection data and CAD models. For example, a known pattern, such as a Barker code, may be provided on a die 210 or between die 210 to produce a unique and easily identified patterning in the links. This may include a known number of links, with a known space, followed by a known number of links. Alternatively, a pattern in the link pitch and/or link width can be used for synchronization. As one example, FIG. 11 shows a graph of reflected alignment laser energy as a function of X position across a link bank having a correlation pattern. In this pattern, a wide link is located at a position of −2 microns, and there is a missing link at a position of +4 microns and a wider link spacing a position of +9 microns. Any or all of these can be used to insure that the correct link 410 is being correlated with the correct reflection signature.

In some cases it may be desirable to initially perform some alignment scans on the dedicated alignment targets 230 around the die perimeter in order to determine a preliminary model of link location. This can be done using machine vision techniques to initially find alignment targets, possibly followed by BTW scans of dedicated alignment targets 230 to further refine the position estimate. This preliminary model of link location can then be refined by the methods described herein. If the preliminary model of link locations is sufficiently accurate to sub-link-pitch tolerances, then the synchronization step described above may not be necessary.

Figure 12A:
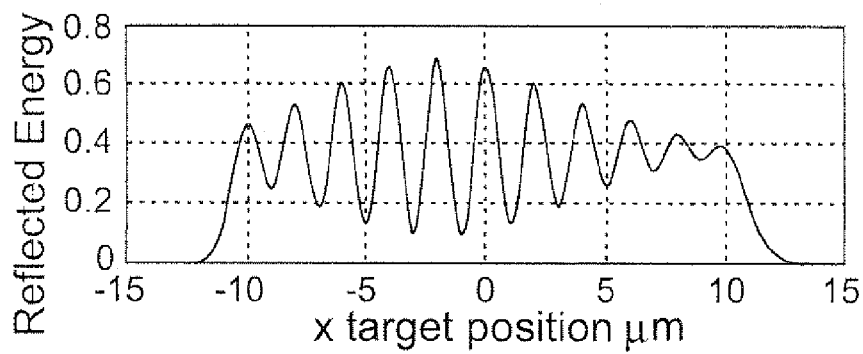
FIGS. 12A and 12B are graphs of reflected alignment laser energy as a function of X position and Z position, respectively, across the middle link bank of FIG. 8 or 9.
Figure 12B:
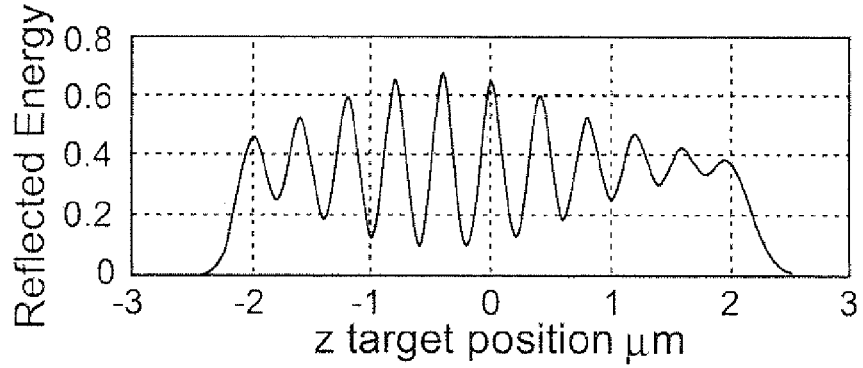

Slewing the Z height while traveling down a row of links can allow simultaneous on-axis position determination and focus height determination, as shown in FIGS. 12A and 12B, which are graphs of reflected alignment laser energy as a function of X position and Z position, respectively, across the middle link bank 420B of FIG. 8 or 9. One way to assess focus is to change the Z height while traveling down the row of links and capturing reflectivity data. In FIG. 12, Z height is moved from −3 to +3 microns while X is simultaneously moved from −15 to +15 microns. The links and beam waist are co-planar at a Z height of −0.4 microns. FIG. 12B shows that the largest reflected energy, corresponding to the tightest spot size, occurs at a Z position of −0.4 microns. Examination of multiple peaks near focus can more accurately determine the best focus height, in particular when the focus height falls between two link positions. Interpolation, averaging, signal processing, curve fitting, and parameter estimation techniques can be used in this case. FIG. 12 demonstrates that it is possible to determine peak location simultaneously with focus. Therefore, on-axis and focus calibration can be performed simultaneously. This provides a quick way to calibrate two alignment variables.

Figure 13:
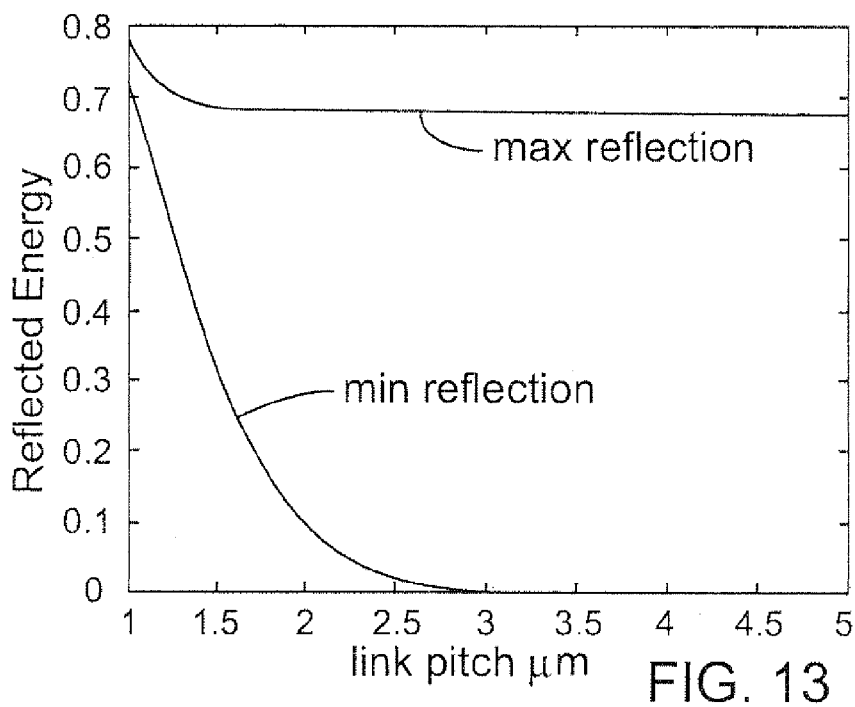
FIG. 13 is a graph of reflected alignment laser energy as a function of link pitch.

FIG. 13 is a graph of reflected alignment laser energy as a function of link pitch. The graph includes two curves—showing the maximum and minimum reflected energies, over a bank of links, as a function of link pitch. As the graphs show, if the link pitch is small in comparison with link width, there may be insufficient contrast between maximum and minimum reflected energy. Good contrast helps the peak finding process. Accordingly, spot size, link pitch, and link width all impact the reflection contrast, as does the wavelength of the metrology laser beam and the materials and layer thickness used for link and wafer construction. These parameters can be optimized to get high quality reflection data for superior calibration.

FIG. 14 is a flowchart of a method 600 according to one embodiment. The method 600 generates (610) a metrology laser beam and propagates (620) that laser beam towards a link 410 on the workpiece 130. The metrology laser beam intersects the workpiece 130 at a metrology laser beam spot 535, which at times passes over links 410, as the method 600 moves (625) the laser beam spot 535 relative to the workpiece 130 along a path on the workpiece 130. A reflection of the metrology laser beam is detected (630) and measured, resulting in a reflected energy signal, such as the one shown in FIG. 10, for example. On the basis of that reflection signal, the method 600 determines (640) the relative position of the metrology laser beam spot 535 relative to the particular links 410 over which the metrology laser beam spot 535 passes. The determining step 640 can be performed using any of the techniques described herein, including, for example, peak (which may be minima or maxima) finding algorithms, surface-fitting mathematical models, synchronization patterns formed by the links 410, and/or comparison with nominal position data such as CAD data. The method 600 then adjusts (650) the position of the processing laser beam spot 135, as necessary, so that the processing laser beam(s) is delivered to selected links more accurately in one or more of the X, Y, and Z dimensions for processing (660) of those selected links. The processing laser beam spot(s) 135 and the alignment laser beam spot 535 may substantially overlap or they may be separated from one another by a fixed or dynamically adjustable displacement. As already indicated, the steps of the method 600 can be performed sequentially or simultaneously to some degree, depending how the method 600 is implemented in a particular situation. The method 600 can be performed using a variety of different hardware configurations, including the ones illustrated in FIGS. 1 and 2, for example.

FIG. 15A is a flowchart of a "pulse-on-reflection" method 700 according to another embodiment. The method 700 generates (610) a metrology laser beam and propagates (620) that laser beam toward an estimated position of a link 410 on the workpiece 130, as the method 700 moves (625) the laser beam spot 535 relative to the workpiece 130 along a path on the workpiece 130. The method 700 is preferably utilized in a case, as illustrated in FIG. 9A, in which the metrology laser beam spot 535 leads the processing laser beam spot 135 during a link run. The path traversed by the laser beam spots 135 and 535 is preferably a path that crosses the centers of the links, as preliminarily determined by a model or preliminary calibration data. The reflection of the metrology laser beam spot 535 off the link 410 produces a reflection signal, which may be an optical signal or converted to an electric form. The method 700 detects (730) rising crossings of the reflection signal across the threshold T. That crossing indicates the position of the center of the link except for a small offset Δd. The method 700 generates (750) a processing laser beam and propagates (760) that laser beam to the position that produced the reflection as detected by the threshold crossing—i.e., to the link.

The method 700 can be repeated at some or all links in a row during a link run. In that case, the reflection signal comprises a series of reflection maxima and non-reflection minima, as shown in FIG. 10 and reproduced in FIG. 15B as a function of X distance as the metrology beam spot 535 moves along the row of links. Each maximum in the reflection signal represents the center of a link, and each minimum represents the center point between two adjacent links. FIG. 15B also shows the threshold T somewhat below the peaks in the detection signal, and the corresponding offset Δd.

The method 700 preferably accounts for the delay involved in generating the laser pulse and propagating it to the workpiece 130 after a laser trigger command is issued. One method to account for the delay is to position the processing laser beam spot 135 lagging behind the metrology laser beam spot 535. The lag distance Δd between the two spots results in a time delay between the time when the reflection from the metrology beam spot 535 crosses the threshold T and the time when the processing laser beam spot 135 is properly positioned over the link. Ideally, the net result of any delay is that the processing laser beam spot 135 moves the proper distance along the workpiece 130 to precisely deliver its pulse centered on the target link or within any desired on-axis tolerance. Alternatively, zero delay may be added between the detecting step 730 and the generating step 750. In some cases, the processing laser beam spot 135 can lead ahead of the metrology laser beam spot 535.

The selection of an appropriate threshold T and delay time, if any, depends upon system variables such as the shape and magnitude of the reflection signal (which in turn depends on the optical properties of the metrology laser beam, the workpiece 130, and the parameters of the reflected energy sensor 198), the velocity at which link runs are performed, and the spacing (if any) between the metrology laser beam spot 535 and the processing laser beam spot 135. Those skilled in the art can select appropriate settings for a given scenario, in light of the teachings herein.

The method 700 processes links where they are found and is to a large degree independent of any position model for precise targeting of the links. This pulse-on-reflection technique offers the advantage of immediacy in time between metrology sensing of a target's position and its processing. That immediacy can further enhance processing accuracy, as the opportunity for positional drift between the times of metrology and processing is reduced. An additional advantage of this pulse-on-reflection technique is that it can compensate for residual errors in the calibration model, errors in the CAD link position database, or fabrication errors resulting in links that are slightly mislocated. Yet another advantage of the pulse-on-reflection technique is that it is largely invariant to the path of the laser beam spots on the workpiece 130. The technique can work well with slanted, curved, and rotational paths, for example. In fact, in a two-beam embodiment, if the metrology laser beam spot 535 and the processing laser beam spot 135 are locked in a fixed relative offset, then the path of those spots is irrelevant.

Figure 16A:
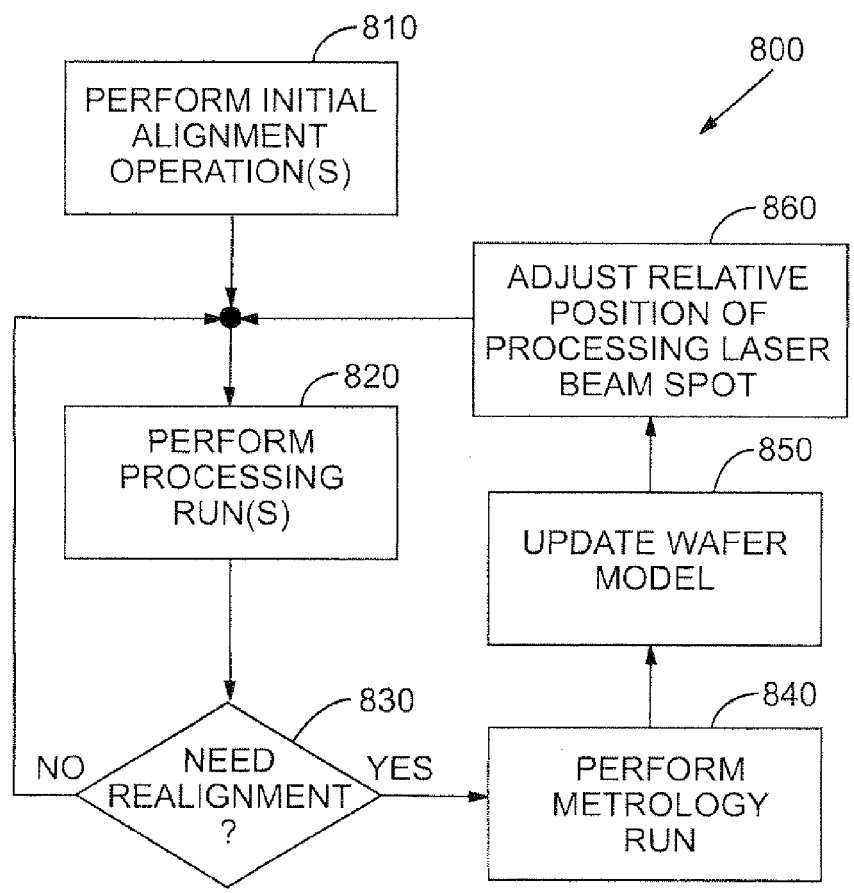
FIGS. 16A-16C are flowcharts of methods according to various embodiments.
Figure 16B:
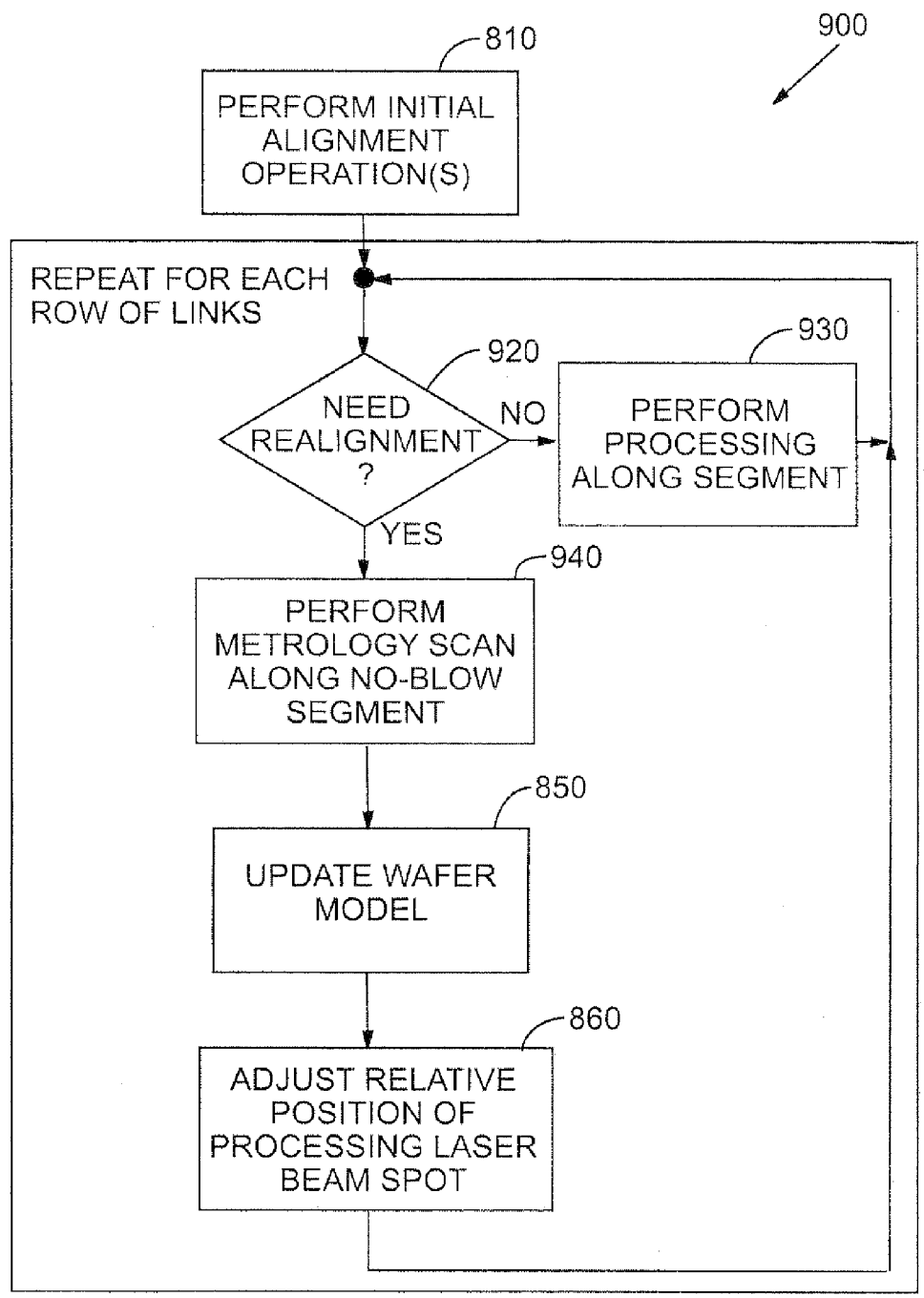
Figure 16C:
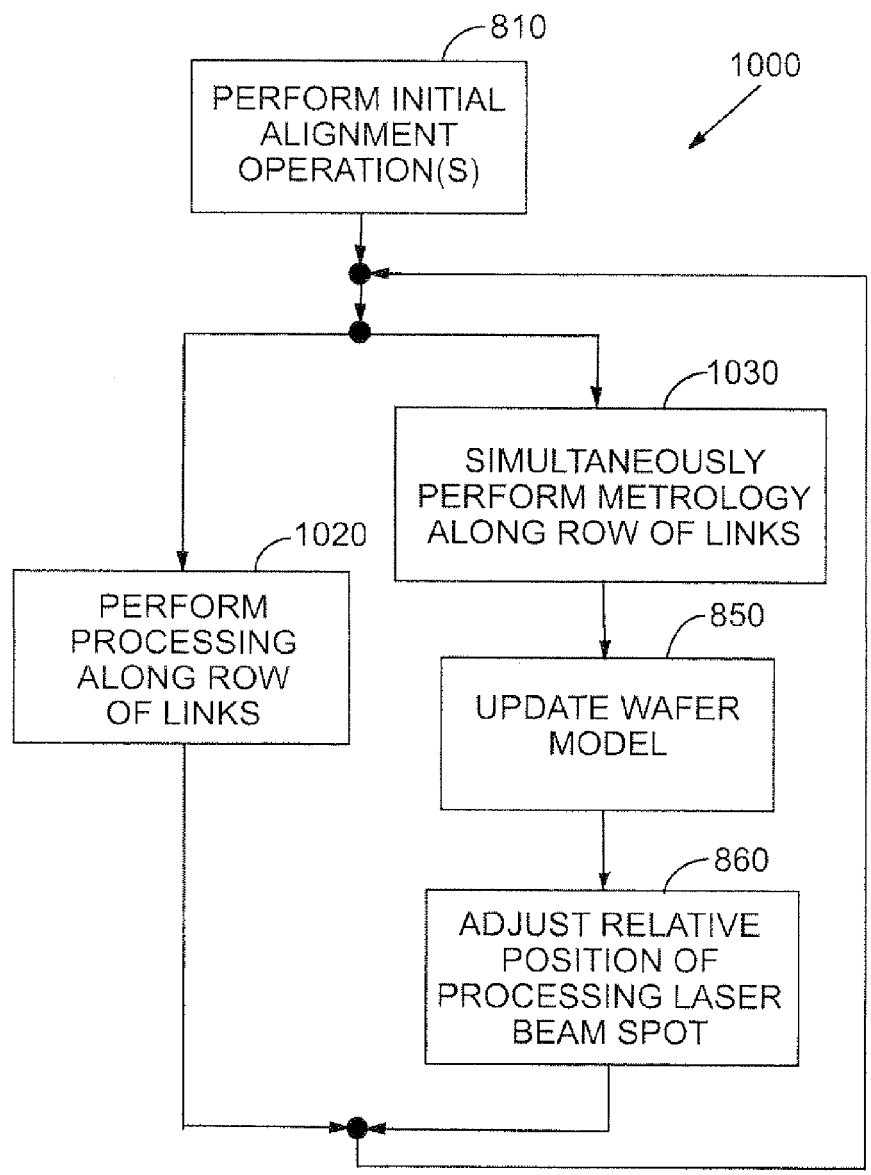

FIGS. 16A-16C are flowcharts of other methods according to various embodiments. Whereas the methods 600 and 700 were described above on a per-link basis, the methods of FIGS. 16A-16C are described below on a per-run basis. In particular, FIG. 16A is a flowchart of a method 800 for periodically or occasionally performing metrology runs intermixed among processing runs. The method 800 begins by optionally performing (810) one or more initial alignment operations, which may include machine vision techniques and/or scanning dedicated alignment targets 230. The initial alignment techniques can also comprise link-based metrology runs performed along one or more X-direction trajectories 370 and/or Y-direction trajectories 380. For example, metrology runs along a small number of roughly equally spaced link rows in the X direction and a small number of equally spaced link rows in the Y direction may be able to generate a sufficiently representative sample of link positions for the purpose of initial alignment. Next, the method 800 performs (820) one or more processing runs along link rows, and then tests (830) whether a realignment is needed. The criterion for realignment can be the lapse of a given amount of time, the separation in space by a given distance from a row that has been the subject of a prior metrology run, some other criterion, or some combination of one or more criteria. If no realignment is needed, the method 800 continues to perform (820) processing run(s). If a realignment is called for, the method 800 performs (840) a metrology run along a row, which is preferably the next row to be processed. In so doing, the method 800 collects actual position data for some or all of the links in that row. In cases in which the method 800 utilizes a positional model of the workpiece 130 for determining the positions of links 410 and other features, the method 800 can utilize the actual positional data from the metrology run to update (850) that model. Details for performing the updating step 850 are described below. In any case, the method 800 adjusts (860) the position of the processing laser beam spot 135 relative to the workpiece 130 and then resumes performing (820) processing runs. The adjustment may be accomplished by an actual hardware movement (e.g., movement of the motion stage 170 or steering of a beam-steering optical element in the propagation path of the processing laser beam 135) or a software or data "movement" (i.e., a manipulation of data affecting the timing and/or positioning of processing laser pulses) or some combination of both. If the adjustment is by movement of the motion stage 170, the subsequent effects of that movement on the metrology laser beam spot 535 should be taken into account.

In the simplest case, a positional model for workpiece features involves a mathematical model for a planar object, such as a planar disc in which points represent the centers of links. That model can be updated by X and/or Y translation to optimally fit the modeled link positions to the measured link positions as determined by one or more metrology measurements. More advanced models may accounts for tilt of the planar object or the shape of the links. Even more advanced models may account for non-planar effects in a mathematical surface. Such effects include warpage or deflection caused by underlying dust particles. Alternatively, rather than a surface model, a three-dimensional object model can by its very nature account for depth effects in the Z dimension. Given a mathematical model, regardless of its type or complexity, it is characterized by parameters. One version of the updating step 850 adapts or adjusts those parameters to cause the link positions according to the model to better match the actual measured link positions. The adaptation or adjustment algorithm can take many forms, as those skilled in the art can appreciate in light of the teachings herein. For example, if the workpiece model is linear in its parameters (which is possible even though the model itself is nonlinear or non-planar), then a least squares algorithm can be implemented to minimize the sum of the squares of the differences between each modeled and actual measured position. This well-known algorithm can be implemented recursively such that every new measured data point refines the model somewhat. Advantages of this algorithm include dilution of extreme or erroneous measurements. This algorithm can be iterated on a per-measurement basis after every link position measurement is taken during a metrology run, or less often, such as at the end of a metrology run to jointly take account of multiple link position measurements gathered during the run. The algorithm can be implementation in a form to best suit such factors as the velocity of the motion stage 170 and the processing capabilities of the controller 190, which preferably performs the algorithm.

The order of runs according to the method 800 may be all X-direction runs, followed by all Y-direction runs, or vice versa. Alternatively, the method 800 may alternately perform some X-direction runs then some Y-direction runs. Intermixing X-direction runs and Y-direction runs can maintain current calibration in both X and Y dimensions, by updating in each direction periodically.

FIG. 16B is flowchart of a method 900 in which metrology and processing are alternately performed during the same link run. The method 900 first performs (810) an optional initial alignment, as described above in connection with the method 800. Then for each row of links requiring processing, the method 900 assumes that the row is divided into segments where processing is required and segments where no processing is required. The latter segments are referred to a "no-blow" segments in FIG. 16B, but it is understood that the purpose of processing need not be to destroy or to "blow" the links. Segmentation can be accomplished by any means from examination of the processing plan (e.g., link defect list or target map 195). Most naturally, a no-blow segment is simply a contiguous segment of the row in which no processing is planned. Because typically only about 10% of links require processing, it is expected that there will be significant no-blow segments in most cases. A no-blow segment may or may not include special-purpose alignment structures, such as illustrated in FIGS. 8B and 8C. Regardless how the no-blow segments are identified, the method 900 tests (920) whether it is in or approaching a no-blow segment. If not, the method 900 simply performs (930) processing along that segment. If it is a no-blow segment, the method 900 performs (940) a metrology scan along that segment (switching laser modes, if necessary, from processing to metrology), optionally updates (850) the positional model for the workpiece 130, and adjusts (860) the position of the processing laser beam spot 135 relative to the workpiece 130 based on the metrology scan. The method 900 is suitable for a system having overlapping or identical metrology and processing laser beam spots, which may be generated by the same laser at the same or different times.

In cases where there are choices to be made in formulating the processing plan in terms of which ones of the various possible redundant elements are activated or left intact to replace a defective element, then the choices can be made to maximize the size and/or distribution of no-blow segments across the workpiece 130 or to produce other desirable distributions of no-blow segments and/or processed links. For example, it may be desirable to distribute some links runs and no-blow segments in both the X and Y processing axes so that metrology link runs can be practiced in both directions. A desirable distribution may also be formulated, in part or whole, to minimize the time required to align and/or process the workpiece 130.

FIG. 16C is a flowchart of a method 1000 in which metrology and processing are performed simultaneously during a link run. The method 1000 first performs (810) an optional initial alignment, as described above in connection with the method 800. Then the method 1000 performs (1020) processing along the row while simultaneously performing (1030) metrology along the same or another row, updating (850) the positional model accordingly (if necessary), and adjusting (860) the position of the processing laser beam spot 135 based on the metrology results. The steps 1020, 1030, 850, and 860, as appropriate, are repeated for each row of links. The method 1000 is suitable for use with the laser beam spot arrangements shown in FIG. 9, for example.

Various methods described herein determine positions of structures on or within a semiconductor substrate relative to a laser beam spot. These methods generate a first laser beam and propagate the first laser beam to a laser beam spot on or within the semiconductor substrate; detect a reflection of the first laser beam from a first structure on or within the semiconductor substrate, thereby generating first reflection data; generate a second laser beam and propagate the second laser beam to a laser beam spot on or within the semiconductor substrate; detect a reflection of the second laser beam from a second structure within a certain distance of the first structure on or within the semiconductor substrate, thereby generating second reflection data; and process the first reflection data and the second reflection data to determine a position of one or more of the first and second structures. The certain distance may be, for example, less than a side dimension of a die 210 or closer, such as about 1 mm, about 100 microns, about 10 microns, or even the same as or on the order of the link pitch spacing.

Various methods described herein also align a laser beam with respect to a semiconductor substrate having a number of structures on or within a semiconductor substrate. The number of structures establishes a density of said structures on or within the semiconductor substrate. These methods generate one or more laser beams; propagate the one or more laser beams onto or within the semiconductor substrate; detect a number of laser beam reflections from a number of respective reflection targets within a given area, thereby generating reflection data; and process the reflection data to align a laser beam with respect to the semiconductor substrate. A quotient of the number of laser beam reflections divided by the given area is on the same order of magnitude as the density of said structures on or within the semiconductor substrate or within one, two, or three orders of magnitude of the density of said structures.

Various methods described herein also position a laser beam spot relative to a semiconductor substrate having structures on or within the semiconductor substrate to be selectively processed by delivering a processing laser beam to a processing laser beam spot. These methods generate a metrology laser beam; propagate the metrology laser beam along a propagation path to a metrology laser beam spot on or near a structure to be selectively processed; move the laser beam spot relative to the semiconductor substrate at a speed; detect a reflection of the metrology laser beam from the structure, thereby generating a reflection signal, while said moving occurs; and determine, based on the reflection signal, a position of the metrology laser beam spot relative to the structure. The speed may be, for example, at or near a processing speed, such as from about 40 mm/s to about 200 mm/s, and in particular faster than about 100 mm/s, about 50 mm/s, or from about 25 mm/s to about 30 mm/s, but may be as slow as about 3 mm/s.

The algorithms for operating the methods and systems illustrated and described herein can exist in a variety of forms both active and inactive. For example, they can exist as one or more software or firmware programs comprised of program instructions in source code, object code, executable code or other formats. Any of the above can be embodied on a computer-readable medium, which include storage devices and signals, in compressed or uncompressed form. Exemplary computer-readable storage devices include conventional computer system RAM (random access memory), ROM (read only memory), EPROM (erasable, programmable ROM), EEPROM (electrically erasable, programmable ROM), flash memory and magnetic or optical disks or tapes. Exemplary computer-readable signals, whether modulated using a carrier or not, are signals that a computer system hosting or running a computer program can be configured to access, including signals downloaded through the Internet or other networks. Concrete examples of the foregoing include distribution of software on a CD ROM or via Internet download. In a sense, the Internet itself, as an abstract entity, is a computer-readable medium. The same is true of computer networks in general.

The terms and descriptions used herein are set forth by way of illustration only and are not meant as limitations. Those skilled in the art will recognize that many variations can be made to the details of the above-described embodiments without departing from the underlying principles of the invention. The scope of the invention should therefore be determined only by the following claims (and their equivalents) in which all terms are to be understood in their broadest reasonable sense unless otherwise indicated.

The invention claimed is:

1. A system for processing structures on or within a semiconductor substrate using a pulsed laser, the system comprising:
   a laser source producing a pulsed processing laser beam for impinging upon selected ones of said structures as well as a metrology laser beam;
   a metrology laser propagation path from the laser source to a metrology laser beam spot on or within the semiconductor substrate, along which the metrology laser beam propagates;
   a processing laser propagation path from the laser source to a processing laser beam spot on or within the semiconductor substrate, along which pulses of the processing laser beam propagate;
   a motion stage configured to cause relative motion between the semiconductor substrate and both the metrology laser beam spot and the processing laser beam spot such that the processing laser beam spot intersects said selected ones of said structures, said motion being in a substantially straight direction;
   a sensor positioned to detect a magnitude of reflection of the metrology laser beam spot from one or more of said structures as the metrology laser beam spot moves relative to the semiconductor substrate, thereby generating a reflection signal; and
   a controller, connected to the sensor, configured to determine, based on the reflection signal, when or where to generate a pulse of the processing laser beam so as to impinge upon said selected ones of said structures.

2. A system as set forth in claim 1, wherein the motion stage moves the semiconductor substrate while the metrology laser beam spot and the processing laser beam spot are still.

3. A system as set forth in claim 1, wherein the motion stage moves the metrology and processing laser beam spots while the semiconductor substrate is still.

4. A system as set forth in claim 1, wherein the motion stage is configured to cause relative motion between the semiconductor substrate and both the metrology laser beam spot and the processing laser beam spot in a direction orthogonal to said straight direction.

5. A system as set forth in claim 1, wherein said structures comprise electrically conductive links having a transverse direction, the links being arranged in a plurality of rows extending in said substantially straight direction, which is orthogonal to the transverse direction of the links.

6. A system as set forth in claim 1, wherein the motion stage comprises an upper stage and a lower stage supporting the upper stage, wherein one of the upper stage or the lower stage moves in said straight direction and the other of the upper stage and the lower stage moves in a direction orthogonal to said straight direction.

7. A system as set forth in claim 1, wherein the motion stage comprises a first stage that moves the metrology and processing laser beam spot and a second stage that moves the semiconductor substrate.

8. A system as set forth in claim 7, wherein the first stage moves in said straight direction and the second stage moves in a direction orthogonal to said straight direction.

9. A system as set forth in claim 5, wherein processing of a structure with the pulsed processing laser beam severs the link and thereby causes the link not to be electrical conductive, and wherein the metrology laser beam has optical properties such that the metrology laser beam does not sever a link on which the metrology laser beam impinges.

10. A system as set forth in claim 1, wherein the laser source comprises:
   a first laser generating the metrology laser beam; and
   a second laser generating the pulsed processing laser beam, wherein the first laser and the second laser are distinct.

11. A system as set forth in claim 1, wherein the laser source comprises a single laser producing both the metrology laser beam and the pulsed processing laser beam.

12. A system as set forth in claim 11, wherein the laser source alternately generates the metrology laser beam and the pulsed processing laser beam.

13. A system as set forth in claim 11, wherein the laser source simultaneously generates the metrology laser beam and the pulsed processing laser beam.

14. A system as set forth in claim 1, wherein the metrology laser beam spot and the processing laser beam spot substantially coincide on or within the semiconductor substrate.

15. A system as set forth in claim 1, wherein the metrology laser beam spot is offset from the processing laser beam spot in said straight direction.

16. A system as set forth in claim 1, wherein the metrology laser beam spot is offset from the processing laser beam spot in a direction perpendicular to said straight direction.

17. A method according to claim 1, wherein the angular velocity of the semiconductor substrate about its approximate center is no more than negligible.

18. A method for accurately sending laser beam pulses from a processing laser to selected processing target structures on or within a semiconductor substrate, wherein at least a subset of the processing target structures are arranged in a substantially straight linear row extending in a lengthwise direction, the method comprising:
   generating a metrology laser beam and propagating the metrology laser beam along a propagation path to a metrology laser beam spot on or within the semiconductor substrate;
   moving the semiconductor substrate relative to the metrology laser beam spot predominantly in the lengthwise direction;
   detecting reflected light energy from the subset of processing target structures as the metrology laser beam spot moves relative to the semiconductor substrate, thereby generating a reflection signal as a function of distance in the lengthwise direction;
   generating processing pulses of the processing laser beam and propagating the processing pulses along a propagation path to a processing laser beam spot on or within the semiconductor substrate; and
   positioning, based on the reflection signal, the processing laser beam spot relative to the semiconductor substrate so as to direct the processing pulses on selected processing target structures.

19. A method according to claim 18, further comprising:
   simultaneously with said moving step, moving the semiconductor substrate relative to the metrology laser beam spot in a direction orthogonal to said lengthwise direction.

20. A method according to claim 18, further comprising:
   simultaneously with said moving step, moving the semiconductor substrate relative to the metrology laser beam spot in a direction normal to a plane of said substrate.

21. A method according to claim 18, wherein determining where to position the processing laser beam spot comprises modifying one or more calibration parameters.

22. A method according to claim 18, wherein the subset comprises a plurality of processing target structures, and the determining step comprises averaging position data associated with individual ones of the processing target structures.

23. A method comprising:
   gathering data regarding the positions of structures to be selectively processed in a first portion of a substantially linear first row of structures on or within a semiconductor substrate by a process comprising:
      generating a metrology laser beam and propagating the metrology laser beam along a propagation path that intersects the substrate at a metrology laser beam spot;
      moving the metrology laser beam spot relative to the semiconductor substrate along the first portion; and
      detecting reflections of the metrology laser beam off the structures in the first portion as the metrology laser beam spot moves relative to the semiconductor substrate, thereby generating a reflection signal; and
   based on the gathered data, directing processing laser pulses onto the semiconductor substrate so as to impinge upon selected structures in a second portion of a substantially linear second row of structures on or within the semiconductor substrate, wherein said second row is distinct from said first row and is substantially parallel to said first row, and wherein the first portion of the first row and the second portion of the second row spatially correspond to one another.

24. A method as set forth in claim 23, further comprising:
   processing the selected structures in the second portion of the second row by:
      generating the processing laser pulses and propagating the pulses along a propagation path that intersects the substrate at a processing laser beam spot; and
      moving the processing laser beam spot relative to the semiconductor substrate along the second row of structures;
      wherein the steps of generating the processing laser pulses and moving the processing laser beam spot are performed in accordance with the determining step so as to cause the processing laser pulses to impinge upon the selected structures.

25. A method as set forth in claim 24, wherein the gathering and directing steps are performed substantially simultaneously.

26. A method as set forth in claim 24, wherein the gathering and directing steps are performed alternately.

27. A method according to claim 23, wherein determining where to direct processing laser pulses comprises modifying one or more calibration parameters.

28. A method according to claim 23, wherein a processing laser beam spot that represents where the processing laser beam pulses impinge upon the semiconductor substrate is offset from the metrology laser beam spot by some distance in the direction in which the first and second rows extend.

29. A method according to claim 23, wherein the metrology laser beam spot moves relative to the semiconductor substrate in the first row substantially in unison with a processing laser beam moving along the second row.

30. A method for positioning a laser beam spot relative to a semiconductor substrate having structures on or within the semiconductor substrate to be selectively processed by delivering a processing laser beam to a processing laser beam spot, the method comprising:

generating a metrology laser beam;

propagating the metrology laser beam along a propagation path to a metrology laser beam spot on or near a structure to be selectively processed;

moving the laser beam spot relative to the semiconductor substrate such that an angular velocity of the semiconductor substrate about its center is less than a quotient of the speed of the laser beam spot relative to the semiconductor substrate divided by a distance between the semiconductor substrate's center and the laser beam spot;

detecting a reflection of the metrology laser beam from the structure, thereby generating a reflection signal, while said moving occurs; and determining, based on the reflection signal, a position of the metrology laser beam spot relative to the structure.

31. A metrology-aided processing method for processing structures on or within a semiconductor substrate, wherein the structures are arranged in a substantially linear row in a row-lengthwise direction, and wherein the individual structures extend in a structure-lengthwise direction transverse to the row-lengthwise direction, the method comprising:

gathering data regarding the positions of structures to be selectively processed in the row of structures by a process comprising:

generating a metrology laser beam and propagating the metrology laser beam along a propagation path that intersects the substrate at a metrology laser beam spot;

moving the metrology laser beam spot relative to the semiconductor substrate in the row-lengthwise direction so that the metrology laser beam spot passes along the structures in a first transverse section of the structures and thereby generates reflections; and detecting reflections of the metrology laser beam off the structures as the metrology laser beam spot moves relative to the semiconductor substrate, thereby generating a reflection signal; and based on the gathered data, directing processing laser pulses onto the semiconductor substrate so as to impinge upon selected structures of said row, wherein the processing laser pulses impinge upon said selected structures in a second transverse section of the structures offset from the first transverse section by some distance in the structure-lengthwise direction.

32. A method according to claim 31, wherein a processing laser beam spot that represents where the processing laser beam pulses impinge upon the semiconductor substrate is offset from the metrology laser beam spot by some distance in the row-lengthwise direction.

33. A method according to claim 31, wherein the metrology laser beam spot moves relative to the semiconductor substrate in the second section of the row substantially in unison with a processing laser beam moving along the first section of the row.

34. A method as set forth in claim 31, wherein the gathering and directing steps are performed substantially simultaneously.

35. A method as set forth in claim 31, wherein the gathering and directing steps are performed alternately.

36. A method according to claim 31, wherein determining where to direct processing laser pulses comprises modifying one or more calibration parameters.

* * * * *